(12) United States Patent
Hu et al.

(10) Patent No.: US 10,735,008 B2
(45) Date of Patent: Aug. 4, 2020

(54) COMPARATOR OFFSET VOLTAGE SELF-CORRECTION CIRCUIT

(71) Applicant: CHINA ELECTRONIC TECHNOLOGY CORPORATION, 24TH RESEARCH INSTITUTE, Chongqing (CN)

(72) Inventors: Rong-Bin Hu, Chongqing (CN); Yong-Lu Wang, Chongqing (CN); Gang-Yi Hu, Chongqing (CN); He-Quan Jiang, Chongqing (CN); Zheng-Ping Zhang, Chongqing (CN); Guang-Bing Chen, Chongqing (CN); Dong-Bing Fu, Chongqing (CN); Yu-Xin Wang, Chongqing (CN); Lei Zhang, Chongqing (CN); Rong-Ke Ye, Chongqing (CN); Can Zhu, Chongqing (CN); Yu-Han Gao, Chongqing (CN)

(73) Assignee: CHINA ELECTRONIC TECHNOLOGY CORPORATION, 24TH RESEARCH INSTITUTE, Chongqing (CN)

( * ) Notice: Subject to any disclaimer, the term of this patent is extended or adjusted under 35 U.S.C. 154(b) by 74 days.

(21) Appl. No.: 16/476,106

(22) PCT Filed: Jun. 27, 2016

(86) PCT No.: PCT/CN2016/087206
§ 371 (c)(1),
(2) Date: Jul. 4, 2019

(87) PCT Pub. No.: WO2017/219377
PCT Pub. Date: Dec. 28, 2017

(65) Prior Publication Data
US 2019/0356325 A1    Nov. 21, 2019

(30) Foreign Application Priority Data

Jun. 20, 2016  (CN) .......................... 2016 1 0444100

(51) Int. Cl.
*H03M 1/06* (2006.01)
*H03K 5/24* (2006.01)

(52) U.S. Cl.
CPC .......... *H03M 1/0607* (2013.01); *H03K 5/249* (2013.01); *H03K 5/2481* (2013.01)

(58) Field of Classification Search
CPC ... H03M 1/0607; H03K 5/2481; H03K 5/249; H03F 3/45183; H03F 3/45766
(Continued)

(56) References Cited

U.S. PATENT DOCUMENTS

| | | | |
|---|---|---|---|
| 6,617,887 B2 * | 9/2003 | Nix | H03F 3/45753 327/337 |
| 7,362,246 B2 * | 4/2008 | Park | H03M 1/1023 341/118 |
| 9,537,499 B2 * | 1/2017 | Harpe | H03M 1/1019 |

FOREIGN PATENT DOCUMENTS

| | | |
|---|---|---|
| CN | 101217263 A | 7/2008 |
| CN | 203377849 U | 1/2014 |

(Continued)

*Primary Examiner* — Brian K Young
(74) *Attorney, Agent, or Firm* — Cheng-Ju Chiang

(57) ABSTRACT

A comparator offset voltage self-correction circuit is disclosed. A comparator offset voltage which is caused by the semiconductor process parameter randomness also has randomness. Due to the randomness of the comparator offset voltage, a reference voltage of a parallel comparator in a parallel-conversion-type analog-to-digital converter is uncertain. If the comparator offset voltage is large, the parallel-conversion-type analog-to-digital converter may even have a functional error. The comparator offset voltage self-correction circuit provided in the present invention can (Continued)

correct a random offset voltage of a comparator to meet requirements. Therefore, by means of the circuit and a method provided in the present invention, adverse influence of the random offset of the comparator on the function and the performance of the parallel-conversion-type analog-to-digital converter is eliminated, thereby greatly improving the speed and the performance of the analog-to-digital converter, in particular the parallel-conversion-type analog-to-digital converter.

10 Claims, 5 Drawing Sheets

(58) Field of Classification Search
USPC .................................................. 341/118, 155
See application file for complete search history.

(56) References Cited

FOREIGN PATENT DOCUMENTS

| | | | |
|---|---|---|---|
| CN | 105049043 A | 11/2015 | |
| CN | 105049051 A | 11/2015 | |
| JP | H11-8557 A | 1/1999 | |

\* cited by examiner

COMPARATOR OFFSET VOLTAGE SELF-CORRECTION CIRCUIT

CROSS REFERENCE TO RELATED APPLICATIONS

The present application is a 35 U.S.C. § 371 National Phase conversion of International (PCT) Patent Application No. PCT/CN2016/087206, filed on Jun. 27, 2016, which further claims benefit of Chinese Patent Application No. 201610444100.2, filed on Jun. 20, 2016, the disclosure of which is incorporated by reference herein. The PCT International Patent Application was filed and published in Chinese.

TECHNICAL FIELD

The present invention belongs to the field of analog and mixed signal integrated circuits, and particularly relates to a comparator offset voltage self-correction circuit.

BACKGROUND

An n-bit parallel-conversion-type analog-to-digital converter (also known as a Flash ADC or a flashing ADC) adopts $2^n$ comparators to compare analog signals $V_{in}$ with $2^n$ reference signals, and then encodes outputs of the comparators to quantize the analog signals. In general, the $2^n$ reference signals are evenly distributed in a certain signal range, which is called a quantization range.

FIG. 1 is a circuit diagram of a 3-bit flash ADC which comprises eight serially-connected resistors (101, 102, 103, 104, 105, 106, 107 and 108), seven parallel operating comparators ($COM_1$, $COM_2$, $COM_3$, $COM_4$, $COM_5$, $COM_6$ and $COM_7$), an encoding circuit 128, an analog signal input port $V_{in}$, a reference voltage port REFA, a reference voltage port REFB, and digital output ports $D_0$, $D_1$ and $D_2$.

The reference voltage port REFA is connected to the positive end of the resistor 108; the negative end of the resistor 108 is connected to the positive end of the resistor 107; the negative end of the resistor 107 is connected to the positive end of the resistor 106; the negative end of the resistor 106 is connected to the positive end of the resistor 105; the negative end of the 105 is connected to the positive end of the resistor 104; the negative end of the resistor 104 is connected to the positive end of the resistor 103; the negative end of the resistor 103 is connected to the positive end of the resistor 102; the negative end of the resistor 102 is connected to the positive end of the resistor 101; and the negative end of the resistor 101 is connected to the reference voltage port REFB.

The maximum value and the minimum value in a voltage quantization range are added to the reference voltage port REFA and the reference voltage port REFB, respectively, so that reference voltages $V_7$, $V_6$, $V_5$, $V_4$, $V_3$, $V_2$ and $V_1$ are generated at the negative ends of the resistors 108, 107, 106, 105, 104, 103, and 102. The non-inverting ends of comparators $COM_7$, $COM_6$, $COM_5$, $COM_4$, $COM_3$, $COM_2$, and $COM_1$ are connected together to receive the analog signals from the port $V_{in}$, and the inverting ends of the comparators are configured to receive the reference voltages $V_7$, $V_6$, $V_5$, $V_4$, $V_3$, $V_2$ and $V_1$, respectively.

The resistance values of the resistors 101, 102, 103, 104, 105, 106, 107 and 108 are the same. There is no current flowing through the inverting ends of the comparators $COM_7$, $COM_6$, $COM_5$, $COM_4$, $COM_3$, $COM_2$, and $COM_1$, so that the reference voltages $V_7$, $V_6$, $V_5$, $V_4$, $V_3$, $V_2$ and $V_1$ are evenly distributed between the voltage ports REFA and REFB, as shown in FIG. 2.

As can be seen from FIG. 2, the reference voltages $V_1$, $V_2$, $V_3$, $V_4$, $V_5$, $V_6$ and $V_7$ divide a signal interval [REFB, REFA] into eight equal intervals. When the signal at the analog signal input port Vin changes from low to high and exceeds a reference voltage $V_i$ (i=1 to 7), the output of the corresponding comparator $COM_i$ is inverted. That is, the outputs of the comparators $COM_1$, $COM_2$, $COM_3$, $COM_4$, $COM_5$, $COM_6$ and $COM_7$ identify and encode the eight signal sections in FIG. 2.

Those skilled in the art know that output encodes of the comparators $COM_1$, $COM_2$, $COM_3$, $COM_4$, $COM_5$, $COM_6$ and $COM_7$ in FIG. 1 are thermometer codes whose disadvantages lie in that a large number of signal lines are required, and the encoding efficiency is very low as lots of codes are wasted. The output ends of the comparators $COM_1$, $COM_2$, $COM_3$, $COM_4$, $COM_5$, $COM_6$ and $COM_7$ are connected to the encoding circuit 128 to convert the thermometer codes to binary codes, so that 3-bit binary codes are output from the output ports $D_0$, $D_1$ and $D_2$.

In the actual implementation of the circuit in FIG. 1, the comparator has an offset. Especially, the offset of the comparator based on the CMOS process is more severe. Thus, an actual reference voltage of the comparator in FIG. 1 is a sum of a reference voltage generated by a resistor string and an offset voltage, as shown in FIG. 3. In FIG. 3, voltage sources $VO_1$, $VO_2$, $VO_3$, $VO_4$, $VO_5$, $VO_6$, and $VO_7$ represent the offset voltages of the comparators $COM_1$, $COM_2$, $COM_3$, $COM_4$, $COM_5$, $COM_6$ and $COM_7$, respectively. In this way, a reference voltage actually seen by a comparator $COM_i$ (i=1 to 7) is ($V_i$+$VO_i$). The offset voltage $VO_i$ (i=1 to 7) has randomness. For different comparators, process conditions and chips, offset voltages are different. A circuit designer can only obtain some statistical results instead of predicting a specific value of the offset voltage.

When the accuracy of the flash ADC is quite high (such as 6-bit or 8-bit conversion accuracy), a difference between adjacent reference voltages is quite small. If the comparator offset voltage in FIG. 3 causes the reference voltage seen by the comparator $COM_i$ (i=1 to 7) to be greater than the reference voltage seen by the comparator $COM_{i+1}$, the flash ADC will lose a code. As shown in FIG. 4, due to the offset, the reference voltage ($V_4$+$V_{O4}$) seen by the comparator $COM_4$ is smaller than the reference voltage ($V_3$+$VO_3$) seen by the comparator $COM_3$. Thus, when the analog input signal $V_{in}$ in FIG. 3 changes from small to large, the comparator $COM_4$ reverses first, and then the comparator $COM_3$ reverses, resulting in code missing.

A traditional method of reducing the comparator offset is to use a larger device. However, this will increase power consumption of a circuit and reduce the operating speed of the circuit.

In the present invention, through a self-correct process, an offset voltage of a comparator is corrected through a reference signal externally connected with a chip or generated inside the chip, so that code missing in the flash ADC is eliminated, and the performance indexes of a DNL and INL are improved. In addition, with the offset correction, the comparator can be implemented through a smaller device, thereby improving the speed of the comparator.

SUMMARY

The present invention provides a comparator offset voltage self-correction circuit, comprising a comparator 123, an offset digital adjustment circuit 122, a successive approximation register 121, a multiplexer 125, an enable port EN, a clock port CLK, a reference voltage input port $V_r$, an analog signal input port $V_{in}$, a correction voltage input port $V_{cal}$ and an output port VOUT.

In the comparator offset voltage self-correction circuit 120, the port $V_r$ is configured to receive a reference voltage; and the port $V_{cal}$ is configured to receive a correction voltage, wherein the correction voltage may be generated by a high-accuracy DAC on the same chip or by a test instrument, and is connected to a chip through a chip pin. The analog signal input port $V_{in}$ is configured to receive an analog signal. The output port is configured to output a comparison result. The multiplexer 125 is connected to the analog signal input port $V_{in}$ during normal operation, and is connected to the correction voltage input port $V_{cal}$ during correction.

The reference voltage input port $V_r$ of the comparator offset voltage self-correction circuit 120 is connected to a port A of the offset digital adjustment circuit 122; a port B of the offset digital adjustment circuit 122 is connected to an inverting input end of the comparator 123, and a non-inverting input end of the comparator 123 is connected to an output port of the multiplexer 125. A first input port of the multiplexer is connected to the correction voltage input port $V_{cal}$, and a second input port of the multiplexer is connected to the analog signal input port $V_{in}$. An output end of the comparator 123 is connected to a data input end $D_{1n}$ of the successive approximation register 121; an enable end EN of the successive approximation register 121 is connected to the enable port EN of the comparator offset voltage self-correction circuit 120; and a clock end CLK of the successive approximation register 121 is connected to the clock port CLK of the comparator offset voltage self-correction circuit 120. Data output ports $D_0, D_1, D_2, D_3, D_4, D_5, D_6$ and $D_7$ of the successive approximation register 121 output data signals $D_0, D_1, D_2, D_3 D_4, D_5, D_6$ and $D_7$ which control data ports $D_0, D_1, D_2, D_3, D_4, D_5, D_6$ and $D_7$ of the offset digital adjustment circuit 122, respectively.

A relationship between the $V_{AB}$ between the port B and the port A of the offset digital adjustment circuit 122 and its data ports $D_0, D_1, D_2, D_3, D_4, D_5, D_6$ and $D_7$ is a weighted summation relationship with an offset of $V_s/2$, the lowest weight bit being $D_0$, the highest weight bit being $D_7$, and the minimum change step size is $V_s/2^7$.

According to the connection relationship, an electric potential of the inverting input end $V_M$ of the comparator 123 is the sum of a voltage of the reference voltage input port $V_r$ and a voltage drop $V_{AB}$ of the ports of the offset digital adjustment circuit 122.

A correction process of the comparator offset voltage self-correction circuit 120 is as follows:

First, the enable signal EN of the comparator offset voltage self-correction circuit 120 is at a low level, the successive approximation register 121 is reset; the digital signals $D_7, D_6, D_5, D_4, D_3, D_2, D_1$ and $D_0$ adopt a default value 10,000,000; a port voltage drop of the offset digital adjustment circuit 122 is 0; and an electric potential of the inverting input end $V_M$ of the comparator is the sum of a reference voltage and a comparator offset voltage;

Second, the level of the enable signal EN jumps from a low level to a high level to start a correction process; the first input port 1 of the multiplexer is connected so that a correction voltage $V_{cal}$ is selected.

Third, a rising edge of the first clock signal CLK arrives, the successive approximation register 121 keeps the default value 10,000,000 of the digital signals $D_7, D_6, D_5, D_4, D_3, D_2, D_1$ and $D_0$ unchanged; and the electric potential of the inverting input end $V_M$ of the comparator is unchanged.

Fourth, the comparator 123 compares voltage signals of the non-inverting input end and the inverting input end of the comparator, and feeds a comparison result back to the data input end $D_{1n}$ of the successive approximation register 121.

If $V_M$ is lower than $V_{cal}$, when the rising edge of the second clock signal CLK arrives, the successive approximation register 121 keeps $D_7$ at 1, while setting $D_6$ as 1, and increasing $V_M$ by $V_s/4$.

If $V_M$ is higher than $V_{cal}$, when the rising edge of the second clock signal CLK arrives, the successive approximation register 121 sets $D_7$ as 0, while setting $D_6$ as 1, and decreasing $V_M$ by $V_s/4$.

Fifth, the comparator 123 compares $V_M$ with $V_{cal}$ again, and feeds a comparison result back to the data input end Dm of the successive approximation register 121.

If $V_M$ is lower than $V_{cal}$, when the rising edge of the third clock signal CLK arrives, the successive approximation register 121 keeps $D_6$ at 1, while setting $D_5$ as 1, and increasing $V_M$ by $V_s/8$.

If $V_M$ is higher than $V_{cal}$, when the rising edge of the third clock signal CLK arrives, the successive approximation register 121 sets $D_6$ as 0, while setting $D_5$ as 1, and decreasing $V_M$ by $V_s/8$.

Sixth, the comparator 123 compares $V_M$ with $V_{cal}$ again, and feeds a comparison result back to the data input end Dm of the successive approximation register 121.

If $V_M$ is lower than $V_{cal}$, when the rising edge of the fourth clock signal CLK arrives, the successive approximation register 121 keeps $D_5$ at 1, while setting $D_4$ as 1, and increasing $V_M$ by $V_s/16$.

If $V_M$ is higher than $V_{cal}$, when the rising edge of the fourth clock signal CLK arrives, the successive approximation register 121 sets $D_5$ as 0, while setting $D_4$ as 1, and decreasing $V_M$ by $V_s/16$.

Similarly, when the rising edge of the fifth clock signal CLK arrives, the successive approximation register 121 determines $D_4$; when the rising edge of the sixth clock signal CLK arrives, the successive approximation register 121 determines $D_3$; when the rising edge of the seventh clock signal CLK arrives, the successive approximation register 121 determines $D_2$; when the rising edge of the eighth clock signal CLK arrives, the successive approximation register 121 determines $D_1$; when the rising edge of the ninth clock signal CLK arrives, the successive approximation register 121 determines $D_0$. So far, the correction process is completed. The values of the digital signals $D_7, D_6, D_5, D_4, D_3, D_2, D_1$ and $D_0$ are kept by the successive approximation register 121 and used in normal operation of the comparator.

The self-correction process is characterized in that in the entire correction process, according to the comparison results of the comparator 123, the electric potential of the inverting input end $V_M$ of the comparator is sequentially increased or decreased by $V_s/2^2$, $V_s/2^3$, $V_s/2^4$, $V_s/2^5$, $V_s/2^6$, $V_s/2^7$, $V_s/2^8$ and $V_s/2^8$ based on $V_{cal}$, and gradually converges at $V_{cal}$. Finally, the difference between $V_M$ and $V_{cal}$ is only $V_s/2^8$. The smaller the $V_s$ is, the closer the $V_M$ is to $V_{cal}$, and meanwhile, the narrower the correction range is. A higher correction digit is adopted to maintain higher correction accuracy and a wider correction range.

As can be seen from the above, an actual reference voltage of the comparator 123 can be corrected to be close to $V_{cal}$ by the correction circuit 120, and reaches certain correction accuracy. $V_{cal}$ is not affected by the comparator offset voltage, and thus is designable and controllable. Therefore, the present invention solves the problem that the process randomness of the comparator offset voltage adversely affects the performance and the function of a flash ADC in the prior art.

The comparator offset voltage self-correction circuit may also adopt a differential structure 200, comprising: a multiplexer 125, an offset digital adjustment amplifier 180, a dynamic comparator 159, a successive approximation register 121, an analog signal input port $V_{in}$, a correction signal input port $V^{cal}$, a reference signal input port $V_r$, a clock port CLK, an enable port EN and an output port VOUT.

In the comparator offset voltage self-correction circuit 200, the analog signal input port $V_{in}$ is configured to receive an analog signal; the correction signal input port $V_{cal}$ is configured to receive a correction signal; the reference signal input port $V_r$ is configured to receive a reference signal; the clock port CLK is configured to receive an input clock signal; the enable port EN is configured to start a correction process; and the output port VOUT is configured to output a comparison result.

In the comparator offset voltage self-correction circuit 200, a first selection end of the multiplexer 125 is connected to the correction signal input port $V_{cal}$, a second selection end thereof is connected to the analog signal input port $V_{in}$, and an output end thereof is connected to a non-inverting input end VP of the offset digital adjustment amplifier 180. An inverting input end $V_M$ of the offset digital adjustment amplifier 180 is connected to the reference signal input port $V_r$; a non-inverting output end $V_{OP}$ of the offset digital adjustment amplifier 180 is connected to a non-inverting input end $V_P$ of the dynamic comparator 159; and an inverting output end $V_{OM}$ of the offset digital adjustment amplifier 180 is connected to an inverting input end $V_M$ of the dynamic comparator 159. An output end of the dynamic comparator 159 is connected to the output port VOUT. Digital output ends $D_0$, $D_1$, $D_2$, $D_3$, $D_4$, $D_5$, $D_6$ and $D_7$ of the successive approximation register 121 are connected to digital input ends $D_0$, $D_1$, $D_2$, $D_3$, $D_4$, $D_5$, $D_6$ and $D_7$ of the offset digital adjustment amplifier 180. An enable end EN of the successive approximation register 121 is connected to the enable port EN, a clock end thereof is connected to the clock input port, and a data end $D_{1n}$ thereof is connected to an output end of the dynamic comparator 159. The clock input port CLK is connected to the clock ends CLK of both the successive approximation register 121 and the dynamic comparator 159.

The offset digital adjustment amplifier 180 comprises a differential pair circuit 140, two symmetric load resistors 141 and 142, two symmetric offset adjustment resistors 143 and 144, two symmetric current mirrors 145 and 146, two symmetric current-mode digital-to-analog converters 147 and 148, an analog signal input port VIN, a reference signal input port VREF, non-inverting and inverting output ports VO+ and VO−, data input ports $D_0$, $D_1$, $D_2$, $D_3$, $D_4$, $D_5$, $D_6$ and $D_7$.

The offset digital adjustment amplifier 180 further comprises non-inverting and inverting input ports $V_P$ and $V_M$, non-inverting and inverting output ports VOP and VOM, and digital input ends D0, D1 D2, D3, D4, D5, D6 and D7.

The differential pair circuit 140 of the offset digital adjustment amplifier 180 comprises two symmetric NMOS transistors 149 and 150, and a tail current source 151. After being connected together, source electrodes of the NMOS transistors 149 and 150 are connected to a current input end of the tail current source 151; and an output end of the tail current source 151 is grounded. The gate electrode of the NMOS transistor 149 is connected to the non-inverting input port $V_P$; and the gate electrode of the NMOS transistor 150 is connected to the inverting input port $V_M$. The drain electrode of the NMOS transistor 149 is connected to the negative end of the load resistor 141; the positive end of the load resistor 141 is connected to a power supply VCC; the drain electrode of the NMOS transistor 150 is connected to the negative end of the load resistor 142; and the positive end of the load resistor 142 is connected to the power supply VCC. The positive end of the offset adjustment resistor 143 is connected to the drain electrode of the NMOS transistor 149, and a negative end thereof is connected to an output end of the current mirror 145 and an inverting output port $V_{OM}$. The positive end of the offset adjustment resistor 144 is connected to the drain electrode of the NMOS transistor 150, and the negative end thereof is connected to an output end of the current mirror 146 and a non-inverting output port $V_{OP}$.

The current mirror 145 of the offset digital adjustment amplifier 180 comprises PMOS transistors 152 and 153; the current mirror 146 comprises PMOS transistors 154 and 155. The gate and drain electrodes of the PMOS transistor 152 are connected together as an input end of current mirror 145, and the source electrode of the PMOS transistor 152 is connected to the power supply VCC. The gate electrode of the PMOS transistor 153 is connected to that of the PMOS transistor 152, the source electrode thereof is connected to the power supply VCC, and the drain electrode thereof is used as an output end of the current mirror 145. The gate and drain electrodes of the PMOS transistor 154 are connected together as an input end of current mirror 146, and the source electrode thereof is connected to the power supply VCC. The gate electrode of the PMOS transistor 155 is connected to that of the PMOS transistor 154, the source electrode thereof is connected to the power supply VCC, and the drain electrode thereof is used as an output end of the current mirror 146. The current mirror 145 mirrors input current $I_1$ thereof to the output end according to a ratio of 1:1 to obtain output current $I_3$, and the current mirror 146 mirrors input current $I_2$ thereof to the output end according to the ratio of 1:1 to obtain output current $I_4$.

In the offset digital adjustment amplifier 180, an output end of the current-mode digital-to-analog converter 147 is connected to the input end of the current mirror 145, and outputs the current $I_1$; and the current output end of the current-mode digital-to-analog converter 148 is connected to the input end of the current mirror 146, and outputs the current $I_2$. The current-mode digital-to-analog converter 147 receives digital signals from the input ports $D_0$, $D_1$, $D_2$, $D_3$, $D_4$, $D_5$, $D_6$ and $D_7$; and the current-mode digital-to-analog converter 148 receives complementary codes of the digital signals $D_7D_6D_5D_4D_3D_2D_1D_0$.

The dynamic comparator 159 of the comparator offset voltage self-correction circuit 200 is of a differential structure which consists of four parts: a preamplifier 160, a latch circuit 161, a digital portion 162, and a bias circuit 1866.

The dynamic comparator 159 further comprises a non-inverting input port, an inverting input port, a clock input port CLK, and an output port VO.

In the dynamic comparator 159, the preamplifier 160 is a differential amplifier which is configured to provide a certain differential gain to reduce a metastable effect of the dynamic comparator 159, and which comprises two symmetric NMOS transistors 163 and 164, another two symmetric NMOS transistors 165 and 166, two symmetric resistors 167 and 168, and a tail current source 169.

In the preamplifier 160, the symmetric NMOS transistors 163 and 164 form a differential pair. After being connected together, the source electrodes of the NMOS transistors 163 and 164 are connected to a current input end of the tail current source 169. A current output end of the tail current source 169 is grounded. The gate electrode of the NMOS transistor 163 is connected to the inverting input port $V_M$ of the comparator 159; and the gate electrode of the NMOS transistor 164 is connected to the non-inverting input port $V_P$ of the comparator 159. The drain electrode of the NMOS transistor 163 is connected to the source electrode of the NMOS transistor 165; and the drain electrode of the NMOS transistor 164 is connected to the source electrode of the NMOS transistor 166. After being connected together, the gate electrodes of the NMOS transistors 165 and 166 are connected to the output end of the bias circuit 186. The drain electrode of the NMOS transistor 165 is connected to the negative end of the resistor 167 and outputs a voltage signal $S_P$; and the drain electrode of the NMOS transistor 166 is connected to the negative end of the resistor 168 and outputs a voltage signal $S_M$. The voltage signals $S_P$ and $S_M$ are a pair of differential signals, which are non-inverting and inverting signals respectively. The positive ends of the resistors 167 and 168 are connected to the power supply VCC.

In the dynamic comparator 159, the preamplifier 160 amplifies the differential signals from the ports $V_P$ and $V_M$ to obtain differential signal $S_P$ and $S_M$.

In the dynamic comparator 159, the latch circuit 161 comprises two symmetric NMOS transistors 172 and 173, a tail current source 174, two symmetric PMOS transistors 175 and 176, two symmetric NMOS transistors 177 and 178, a PMOS switching transistor 180, and an NMOS switching transistor 179.

In the latch circuit 161, the NMOS transistors 172 and 173 form a differential pair. After being connected together, the source electrodes of the NMOS transistors 172 and 173 are connected to the current input end of current source 174; and the current output end of the current source 174 is grounded. The gate electrode of the NMOS transistor 172 receives the voltage signal $S_M$; and the gate electrode of the NMOS transistor 173 receives the voltage signal $S_P$. A lower plate of the capacitor 170 is connected to the gate electrode of the NMOS transistor 173, and an upper plate thereof is connected to the node C. A lower plate of the capacitor 171 is connected to the gate electrode of the NMOS transistor 172, and an upper plate thereof is connected to the node D. The PMOS transistors 175 and 176 are cross-coupled: the gate electrode of the PMOS transistor 175 is connected to the drain electrode of the PMOS transistor 176, and the gate electrode of the PMOS transistor 176 is connected to the drain electrode of the PMOS transistor 175. The source electrodes of the PMOS transistors 175 and 176 are connected to the power supply VCC. The drain electrode of the PMOS transistor 175 is connected to a node C, and the drain electrode of the PMOS transistor 176 is connected to a node D. The NMOS transistors 177 and 178 are cross-coupled: the gate electrode of the NMOS transistor 177 is connected to the drain electrode of the NMOS transistor 178, and the gate electrode of the NMOS transistor 178 is connected to the drain electrode of the NMOS transistor 177. The drain electrode of the NMOS transistor 177 is connected to the node D, and the drain electrode of the NMOS transistor 178 is connected to the node C. After being connected together, the source electrodes of the NMOS transistors 177 and 178 are connected to the drain electrode of the NMOS switching transistor 179, the source electrode of the NMOS switching transistor 179 is grounded, and the gate electrode of the NMOS switching transistor 179 is connected to the clock input port CLK. The source electrode of the PMOS switching transistor 180 is connected to the node C, the drain electrode thereof is connected to the node D, and the gate electrode thereof is connected to the clock input port CLK.

A working process of the latch circuit 161 is as follows: when the clock signal CLK is at a low level, the NMOS switching transistor 179 is turned off, and the cross-coupled NMOS transistors 177 and 178 do not work as no current flows through the transistors. The PMOS switching transistor is turned on, the nodes C and D are short-circuited, and the cross-coupled PMOS transistors 175 and 176 work as a diode as the gate electrodes and drain electrodes thereof are short-circuited.

The voltage signals $S_P$ and $S_M$ are applied on the gate electrodes of the differential pair transistors 173 and 172, respectively. The current of the tail current source 174 is redistributed: when $S_P$ is greater than $S_M$, the current flowing through the NMOS transistor 173 is greater than the current flowing through the NMOS transistor 172; and when $S_M$ is greater than $S_P$, the current flowing through the NMOS transistor 172 is greater than the current flowing through the NMOS transistor 173. A specific distribution ratio is determined by a transconductance of the differential pair formed by the transconductance NMOS transistors 172 and 173.

When the rising edge of the clock signal CLK arrives, a level of the clock signal changes from a low level to a high level. The NMOS switching transistor 179 is turned on, and the cross-coupled NMOS transistors 177 and 178 start to work. Meanwhile, the PMOS switching transistor is turned off, the nodes C and D are disconnected, and the gate electrodes and the drain electrodes of the cross-coupled PMOS transistors 175 and 176 are disconnected.

When the rising edge of the clock signal arrives, the voltage signal $S_M$ is greater than the voltage signal $S_P$, the current flowing through the transistor 172 is greater than the current flowing through the transistor 173. After the nodes C and D are disconnected, a voltage at the node C is pulled down, and a voltage at the node D is pulled up. The cross-coupled NMOS transistors 177 and 178 and the cross-coupled PMOS transistors 175 and 176 form a positive feedback mechanism through which the node C is quickly pulled to a ground potential GND and the node D to a power supply VCC.

When the rising edge of the clock signal arrives, the voltage signal $S_P$ is greater than the voltage signal $S_M$, the current flowing through the transistor 173 is greater than the current flowing through the transistor 172. After the nodes C and D are disconnected, a voltage at the node D is pulled down, and a voltage at the node C is pulled up. The cross-coupled NMOS transistors 177 and 178 and the cross-coupled PMOS transistors 175 and 176 form a positive feedback mechanism through which the node D is quickly pulled to the ground potential GND and the node C to the power supply VCC.

It can be seen that after being amplified by the preamplifier, a difference between the port signal $V_P$ and the port signal $V_M$ is latched on the rising edge of the clock signal, and is rapidly amplified to values between the ground and the power supply. That is, when $V_P$ is greater than $V_M$, the node C obtains a power supply potential VCC, and the node D obtains a ground potential; and when $V_P$ is smaller than $V_M$, the node D obtains a power supply potential VCC, and the node C obtains a ground potential.

The digital portion 162 of the dynamic comparator 159 comprises two NAND gates 181 and 182, and an inverter 183. The NAND gates 181 and 182 are cross-coupled: an output end of the NAND gate 181 is connected to an input end of NAND gate 182, and an output end of NAND gate 182 is connected to an input end of the NAND gate 181. The other input end of the NAND gate 181 is connected to the node C, and the other input end of the NAND gate 182 is connected to the node D. An input end of the inverter 183 is connected to the output end of the NAND gate 181, and an output end of the inverter 183 is connected to the output port VO of the dynamic comparator 159. The digital portion 162 converts differential signals of the nodes C and D into single-ended digital signals to be output.

The comparator offset voltage self-correction circuit 200 is characterized in that the analog signal Vin, the correction signal Vcal and the reference signal Vr may also be differential signals. Accordingly, the non-inverting input end ($V_{P+}$, $V_{P-}$) and the inverting input end ($V_{M+}$, $V_{M-}$) of the offset digital adjustment amplifier 180 are differential input ends; and another differential pair circuit 159 is added, and is symmetric to the differential pair circuit 140. The differential pair circuit 159 comprises two symmetric NMOS transistors 156 and 157, and a tail current source 158. After being connected together, the source electrodes of the NMOS transistors 156 and 157 are connected to a current input end of the tail current source 158. A current output end of the tail current source 158 is grounded. The drain electrode of the NMOS transistor 156 is connected to the drain electrode of the NMOS transistor 149 and the negative end of the load resistor 141. The drain electrode of the NMOS transistor 157 is connected to the drain electrode of the NMOS transistor 150 and the negative end of the load resistor 142. The gate electrode of the NMOS transistor 149 is connected to the positive electrode $V_{P+}$ of the non-inverting differential input end, and the gate electrode of the NMOS transistor 157 is connected to the negative electrode $V_{P-}$ of the non-inverting differential input end. The gate electrode of the NMOS transistor 150 is connected to the positive electrode $V_{M+}$ of the inverting differential input end, and the gate electrode of the NMOS transistor 149 is connected to the negative electrode $V_P$ of the non-inverting differential input end.

The present invention has the following beneficial effects. Through a self-correct process, an offset voltage of a comparator is corrected through a reference signal externally connected with a chip or generated inside the chip, so that code missing in the flash ADC is eliminated, and the performance indexes of a DNL and INL are improved. In addition, with the offset correction, the comparator can be implemented through a smaller device, thereby improving the speed of the comparator.

In the description of the present invention, according to a convention in the art, a port represents a wire network connected to an external circuit in a unit circuit. The name of the port appears in a symbol diagram of the unit circuit and an internal circuit diagram of the unit. For convenience of description, sometimes, the name of the port, node or wire network is configured to represent a voltage signal at the port, node, or wire network without confusion.

The above is well known to those skilled in the art and is indicated herein to enable a person of ordinary skill in the art to understand the intention of the present invention.

DETAILED DESCRIPTION

The implementations of the present invention are illustrated below through specific examples, and other advantages and effects of the present invention can be easily understood by those skilled in the art through the contents disclosed in the description of the present invention. The present invention can also be implemented or applied by different specific embodiments. Moreover, various modifications and changes may be made to all details in this description based on different viewpoints and applications without departing from the spirit of the present invention. It should be noted that the following embodiments and features therein may be combined with each other without conflict.

It should be noted that the diagrams provided in the following embodiments merely schematically illustrate the basic concept of the present invention, and only the components related to the present invention are shown in the diagrams, so that the diagrams are not drawn in accordance with the number, shape and size of the components in actual implementations. The type, the number and the proportion of the components in the actual implementations can be arbitrarily changed, and layouts of the components may be more complicated.

Figure 5:
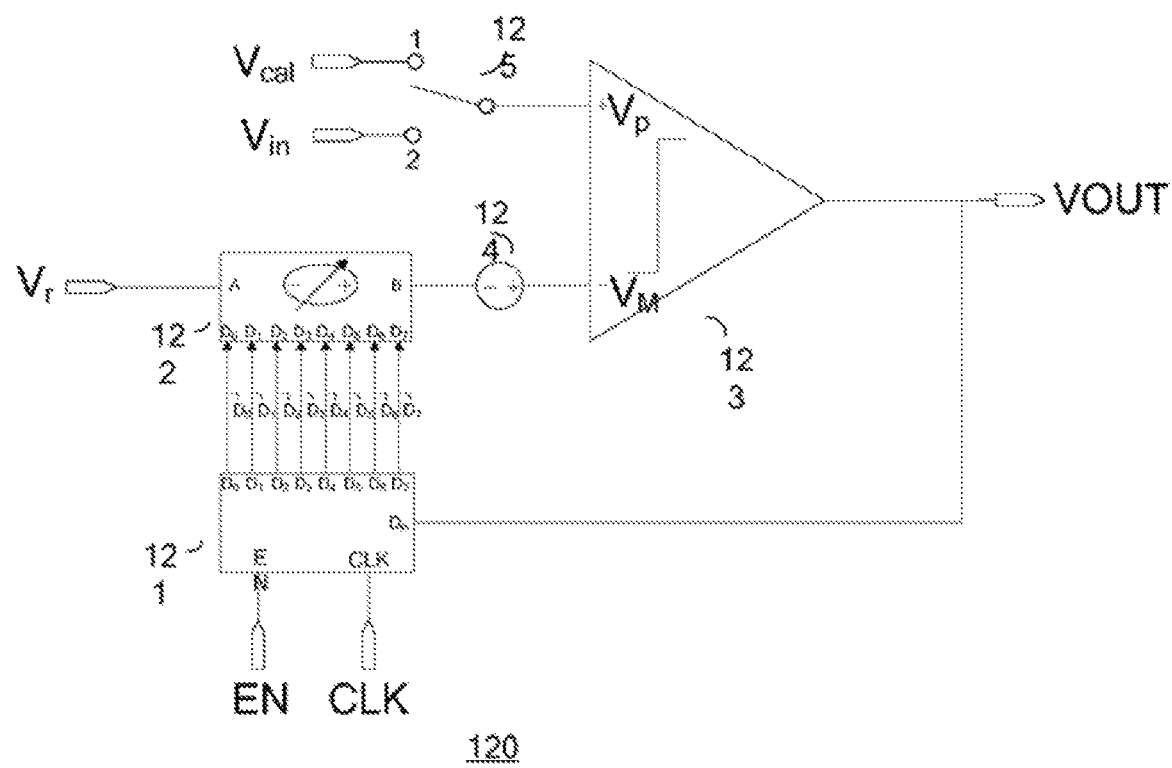
FIG. 5 is a schematic diagram of a comparator offset voltage self-correction circuit according to the present invention.

FIG. 5 is a schematic diagram of a comparator offset voltage self-correction circuit 120 according to the present invention. The comparator offset voltage self-correction circuit 120 comprises a comparator 123, an offset digital adjustment circuit 122, a successive approximation register 121, a multiplexer 125, an enable port EN, a clock port CLK, a reference voltage input port $V_r$, an analog signal input port $V_{in}$, a correction voltage input port $V_{cal}$ and an output port VOUT.

Figure 3:
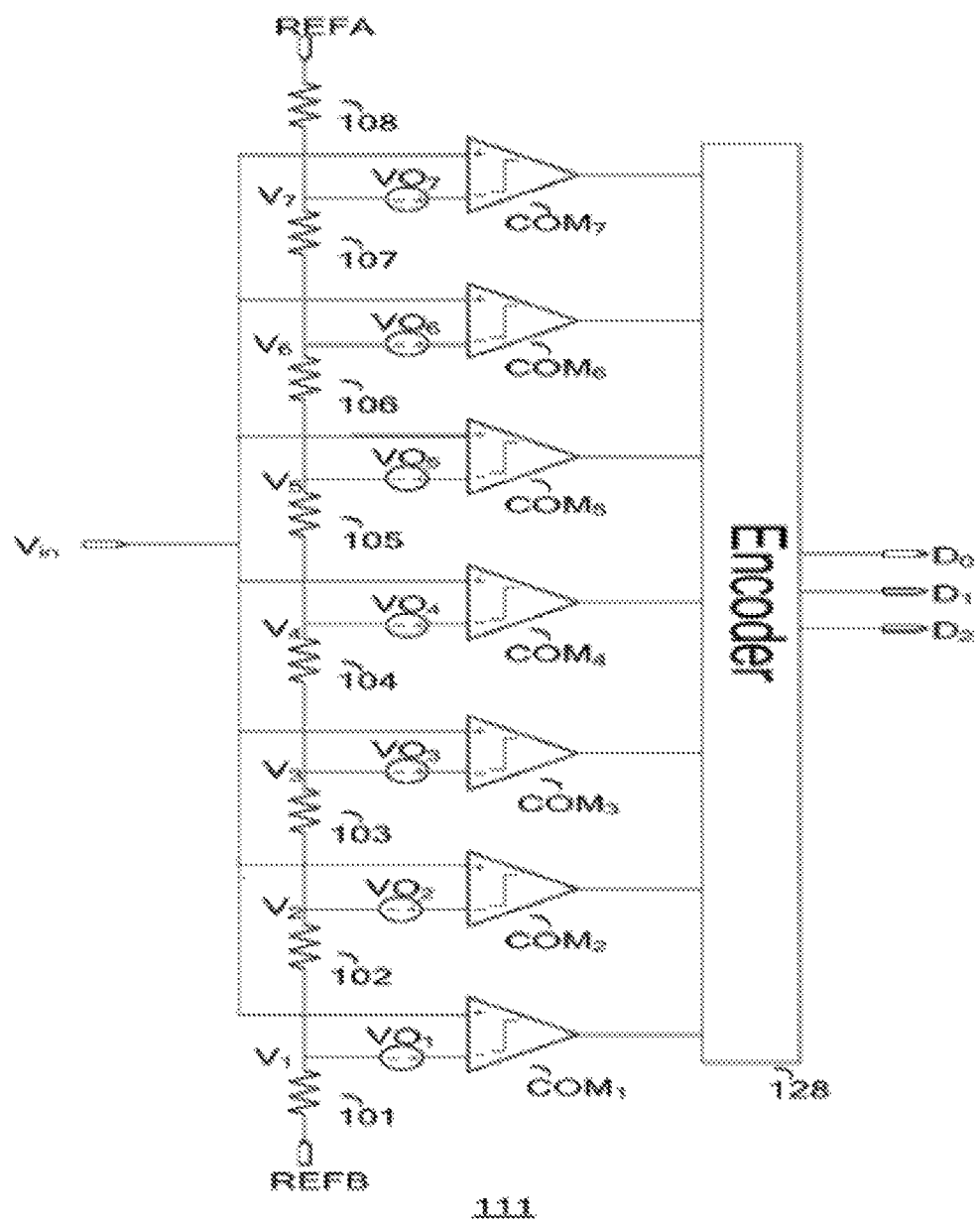
FIG. 3 is a circuit diagram of a 3-bit parallel-conversion-type analog-to-digital converter containing a comparator offset voltage.
Figure 4:
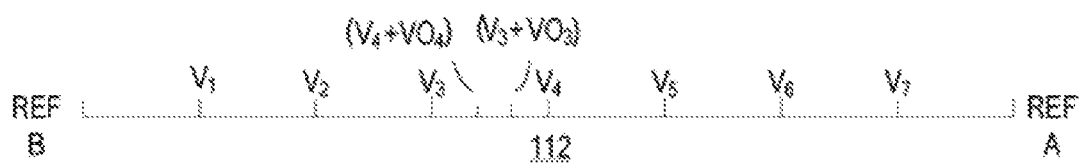
FIG. 4 shows a comparator reference voltage change caused by comparator offset.

The voltage source 124 is configured to simulate an actual comparator offset voltage; the port $V_r$ receives a reference voltage generated by a resistor string in FIG. 3; and the port $V_{cal}$ receives a correction voltage which may be generated by a high-accuracy DAC on the same chip or by a test instrument, and which is connected to a chip through a chip pin. The analog signal input port $V_{in}$ is configured to receive an analog signal. The output port is configured to output a comparison result. The multiplexer 125 is connected to the analog signal input port $V_{in}$ during normal operation, and is connected to the correction voltage input port $V_{cal}$ during correction.

The reference voltage input port $V_r$ is connected to a port A of the offset digital adjustment circuit 122. A port B of the offset digital adjustment circuit 122 is connected to a negative end of the voltage source 124. The positive end of the voltage source 124 is connected to the non-inverting input end of the comparator 123; and a non-inverting input end of the comparator 123 is connected to an output port of the multiplexer 125. A first input port of the multiplexer is connected to the correction voltage input port $V_{cal}$, and a second input port of the multiplexer is connected to the analog signal input port $V_{in}$. An output end of the comparator 123 is connected to a data input end $D_{1n}$ of the successive approximation register 121; an enable end EN of the successive approximation register 121 is connected to the enable port EN; and a clock end CLK of the successive approximation register 121 is connected to the clock port CLK. Data output ports $D_0$, $D_1$, $D_2$, $D_3$, $D_4$, $D_5$, $D_6$ and $D_7$ of the successive approximation register 121 output data signals $D_0$, $D_1$, $D_2$, $D_3$, $D_4$, $D_5$, $D_6$ and $D_7$ which control data ports $D_0$, $D_1$, $D_2$, $D_3$, $D_4$, $D_5$, $D_6$ and $D_7$ of the offset digital adjustment circuit 122, respectively.

A relationship between the voltage $V_{AB}$ between the port B and the port A of the offset digital adjustment circuit 122 and the digital signal port signals $D_0$, $D_1$, $D_2$, $D_3$, $D_4$, $D_5$, $D_6$ and $D_7$ is as follows:

$$V_{AB} = V_S \sum_{i=0}^{7} \frac{D_i}{2^{s-i}} - \frac{V_s}{2} \quad (1)$$

It can be seen from equation (1) that the relationship between the voltage $V_{AB}$ between the port B and the port A of the offset digital adjustment circuit 122 and the digital signals $D_0$, $D_1$, $D_2$, $D_3$, $D_4$, $D_5$, $D_6$ and $D_7$ is a weighted summation relationship with an offset of $V_s/2$; the lowest weight bit is $D_0$, the highest weight bit is $D_7$; and the minimum change step size is $V_s/2^8$. Vs is a design variable.

According to Kirchhoff's law, the electric potential at the inverting input end $V_M$ of the comparator is $$V_M = V_{124} + V_{AB} + V_r \quad (2).$$

In the above equation, $V_{124}$ represents the voltage across the voltage source 124. $V_{124}$ and $V_r$ are constant with respect to the comparator to be corrected. According to the equation (1), the $V_{AB}$ is digitally adjustable, so is the $V_M$. The electric potential at the non-inverting input end of the comparator is $V_{cal}$.

Figure 6:
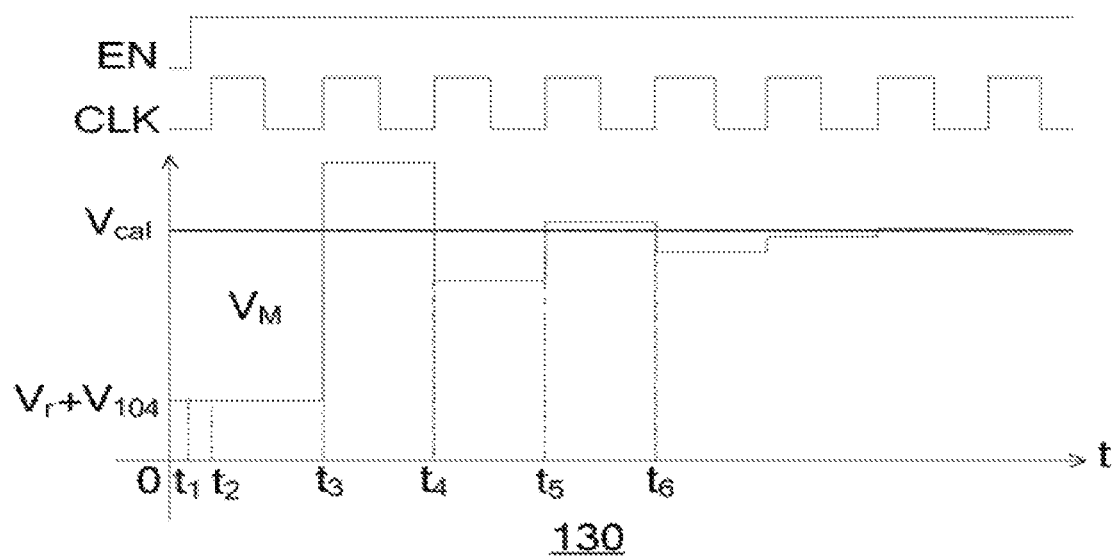
FIG. 6 is a correction timing chart of the comparator offset voltage self-correction circuit according to the present invention.

The correction process of the comparator offset self-correction circuit 120 shown in FIG. 5 is as follows:

As shown in FIG. 6, at first, the enable signal EN is at a low level, the successive approximation register 121 is reset, and the digital signals $D_7$, $D_6$, $D_5$, $D_4$, $D_3$, $D_2$, $D_1$ and $D_0$ adopt a default value 10,000,000. According to the equation (1), $V_{AB}$ is 0. According to the equation (2), the electric potential of the inverting input end $V_M$ of the comparator is $(V_r + V_{124})$, as shown at time zero in the figure.

At time t1, the level of the enable signal EN jumps from a low level to a high level to start a correction process, the first input port 1 of the multiplexer is connected so that the correction voltage $V_{cal}$ is selected. Then, a rising edge of the first clock signal CLK arrives (as shown at time t2 in FIG. 6), the successive approximation register 121 keeps the default value 10,000,000 of the digital signals $D_7$, $D_6$, $D_5$, $D_4$, $D_3$, $D_2$, $D_1$ and $D_0$ unchanged; and the electric potential $(V_r + V_{124})$ of the inverting input end $V_M$ of the comparator is unchanged. Afterwards, the comparator 123 compares voltage signals of the non-inverting and inverting input ends thereof, and feeds a comparison result back to the data input end $D_{1n}$ of the successive approximation register 121.

If $V_M$ is lower than $V_{cal}$, when the rising edge of the second clock signal CLK arrives, the successive approximation register 121 keeps $D_7$ at 1, while setting $D_6$ as 1. According to the equations (1) and (2), $V_M$ is increased by $V_s/4$ as shown at time t3 in FIG. 6.

If $V_M$ is higher than $V_{cal}$, when the rising edge of the second clock signal CLK arrives, the successive approximation register 121 sets $D_7$ as 0, while setting $D_6$ as 1. According to the equations (1) and (2), $V_M$ is decreased by $V_s/4$.

Then, the comparator 123 compares $V_M$ with $V_{cal}$ again, and feeds a comparison result back to the data input end $D_{1n}$ of the successive approximation register 121.

If $V_M$ is lower than $V_{cal}$, when the rising edge of the third clock signal CLK arrives, the successive approximation register 121 keeps $D_6$ at 1, while setting $D_5$ as 1. According to the equations (1) and (2), $V_M$ is increased by $V_s/8$.

If $V_M$ is higher than $V_{cal}$, when the rising edge of the third clock signal CLK arrives, the successive approximation register 121 sets $D_6$ as 0, while setting $D_5$ as 1. According to the equations (1) and (2), $V_M$ is decreased by $V_s/8$ as shown at time t4 in FIG. 6.

Then, the comparator 123 compares $V_M$ with $V_{cal}$ again, and feeds a comparison result back to the data input end $D_{1n}$ of the successive approximation register 121.

If $V_M$ is lower than $V_{cal}$, when the rising edge of the fourth clock signal CLK arrives, the successive approximation register 121 keeps $D_5$ at 1, while setting $D_4$ as 1. According to the equations (1) and (2), $V_M$ is increased by $V_s/16$ as shown at time t5 in FIG. 6.

If $V_M$ is higher than $V_{cal}$, when the rising edge of the fourth clock signal CLK arrives, the successive approximation register 121 sets $D_5$ as 0, while setting $D_4$ as 1. According to the equations (1) and (2), $V_M$ is decreased by $V_s/16$.

Similarly, when the rising edge of the fifth clock signal CLK arrives, the successive approximation register 121 determines $D_4$; when the rising edge of the sixth clock signal CLK arrives, the successive approximation register 121 determines $D_3$; when the rising edge of the seventh clock signal CLK arrives, the successive approximation register 121 determines $D_2$; when the rising edge of the eighth clock signal CLK arrives, the successive approximation register 121 determines $D_1$; and when the rising edge of the ninth clock signal CLK arrives, the successive approximation register 121 determines $D_0$. So far, the correction process is completed. The values of the digital signals $D_7$, $D_6$, $D_5$, $D_4$, $D_3$, $D_2$, $D_1$ and $D_0$ are kept by the successive approximation register 121 and used in normal operation of the comparator.

In the entire correction process, according to the comparison results of the comparator 123, the electric potential of the inverting input end $V_M$ of the comparator is sequentially increased or decreased by $V_s/2^2$, $V_s/2^3$, $V_s/2^4$, $V_s/2^5$, $V_s/2^6$, $V_s/2^7$, $V_s/2^8$ and $V_s/2^8$ based on Vcal, and gradually converges at $V_{cal}$. Finally, the difference between $V_M$ and $V_{cal}$ is only $Vs/2^8$. The smaller the $V_s$ is, the closer the $V_M$ is to $V_{cal}$, and meanwhile, the narrower the correction range is. A higher correction digit, such as 10 bits, 12 bits, 14 bits, is adopted to maintain higher correction accuracy and a wider correction range.

As can be seen from the above, the actual reference voltage of the comparator can be corrected to be close to $V_{cal}$ by the correction circuit shown in FIG. 5, and certain correction accuracy can be achieved. $V_{cal}$ is not affected by the comparator offset voltage, and thus is designable and controllable. Therefore, the present invention solves the problem that the process randomness of the comparator offset voltage adversely affects the performance and the function of a flash ADC in the prior art.

FIG. 5 is only a schematic block diagram for explaining the idea of the present invention. An actual circuit block diagram 200 of the present invention is shown in FIG. 7 and comprises a multiplexer 125, an offset digital adjustment amplifier 180, a dynamic comparator 159, a successive approximation register 121, an analog signal input port $V_{in}$, a correction signal input port $V_{cal}$, a reference signal input port $V_r$, a clock port CLK, an enable port EN and an output port VOUT.

Figure 1:
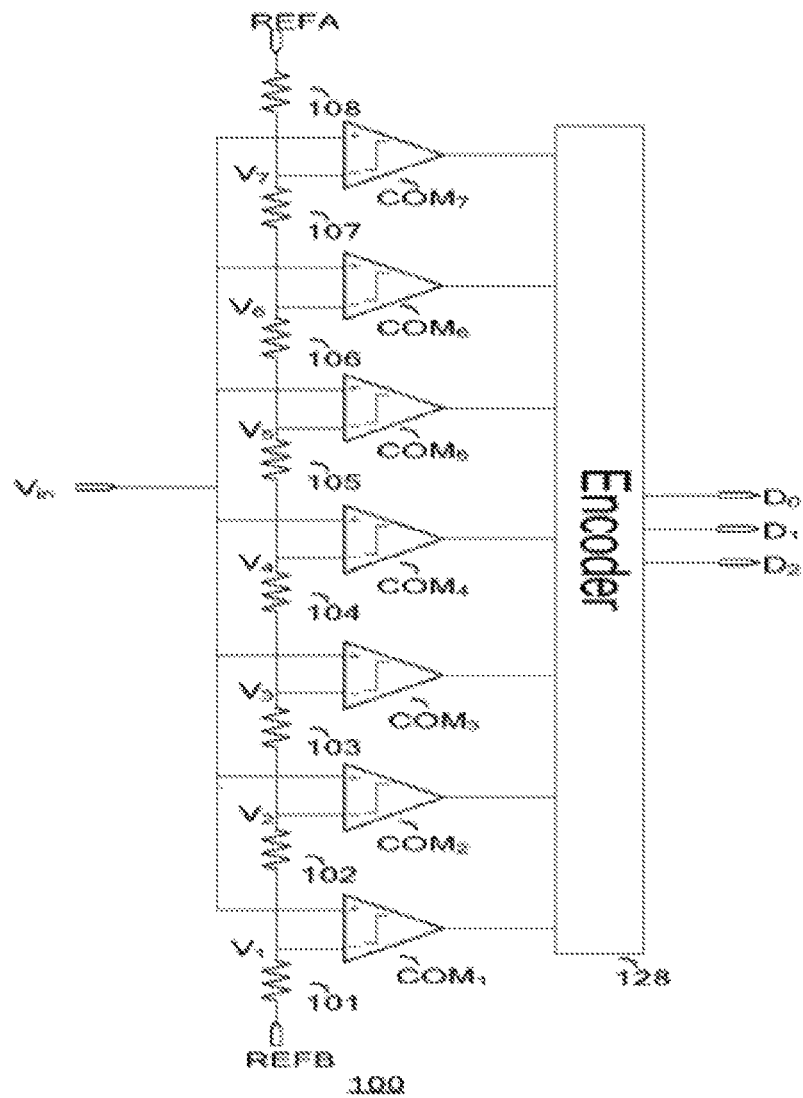
FIG. 1 is a circuit diagram of a 3-bit parallel-conversion-type analog-to-digital converter.
Figure 2:
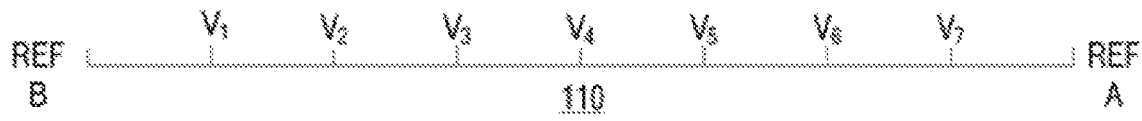
FIG. 2 is a comparator reference voltage distribution diagram under an ideal condition.

The analog signal input port $V_{in}$ is configured to receive an analog signal; the correction signal input port $V_{cal}$ is configured to receive a correction signal; the reference signal input port $V_r$ is configured to receive a reference signal (such as the reference voltage $V_i$ in FIG. 1, i=1 to 7); the clock port CLK is configured to receive an input clock signal; the enable port EN is configured to start a correction process; and the output port VOUT is configured to output a comparison result.

A first selection end of the multiplexer 125 is connected to the correction signal input port $V_{cal}$, a second selection end thereof is connected to the analog signal input port $V_{in}$, and an output end thereof is connected to a non-inverting input end $V_P$ of the offset digital adjustment amplifier 180. An inverting input end $V_M$ of the offset digital adjustment amplifier 180 is connected to the reference signal input port $V_r$. A non-inverting output end $V_{OP}$ of the offset digital adjustment amplifier 180 is connected to a non-inverting input end $V_P$ of the dynamic comparator 159; and an inverting output end $V_{OM}$ of the offset digital adjustment amplifier 180 is connected to an inverting input end $V_M$ of the dynamic comparator 159. An output end of the dynamic comparator 159 is connected to the output port VOUT. Digital output ends $D_0$, $D_1$, $D_2$, $D_3$, $D_4$, $D_5$, $D_6$ and $D_7$ of the successive approximation register 121 are connected to digital input ends $D_0$, $D_1$, $D_2$, $D_3$, $D_4$, $D_5$, $D_6$ and $D_7$ of the offset digital adjustment amplifier 180. An enable end EN of the successive approximation register 121 is connected to the enable port EN, a clock end thereof is connected to the clock input port, and a data end $D_{1n}$ thereof is connected to an output end of the dynamic comparator 159. The clock input port CLK is connected to the clock ends CLK of both the successive approximation register 121 and the dynamic comparator 159.

Figure 7:
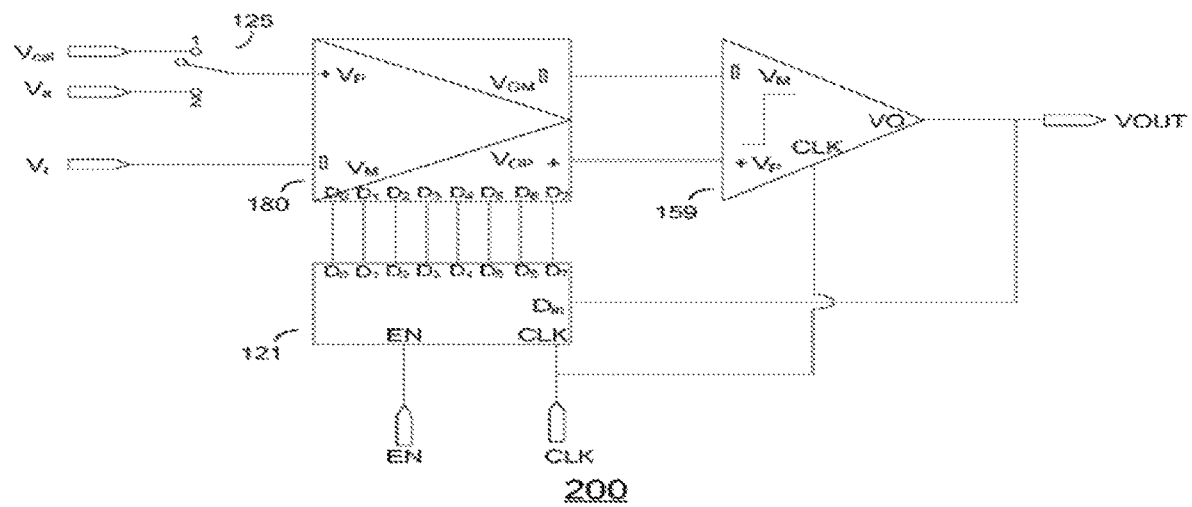
FIG. 7 is an actual circuit block diagram of the comparator offset voltage self-correction circuit according to the present invention.

Compared with the circuit shown in FIG. 5, in the circuit shown in FIG. 7, an offset digital adjustment amplifier 180 replaces the offset digital adjustment circuit 122, and a dynamic comparator 159 replaces the comparator 123 because the dynamic comparator has higher sensitivity and resolution. As FIG. 7 is an actual circuit block diagram, the offset voltage is not listed separately, but is included in the dynamic comparator 159. The correction process for the circuit shown in FIG. 7 is similar to that shown in FIG. 5, which will not be repeated herein.

In the following description, unless otherwise specified, a substrate of the NMOS transistor is grounded, and a substrate of the PMOS transistor is connected to a power supply.

Figure 8:
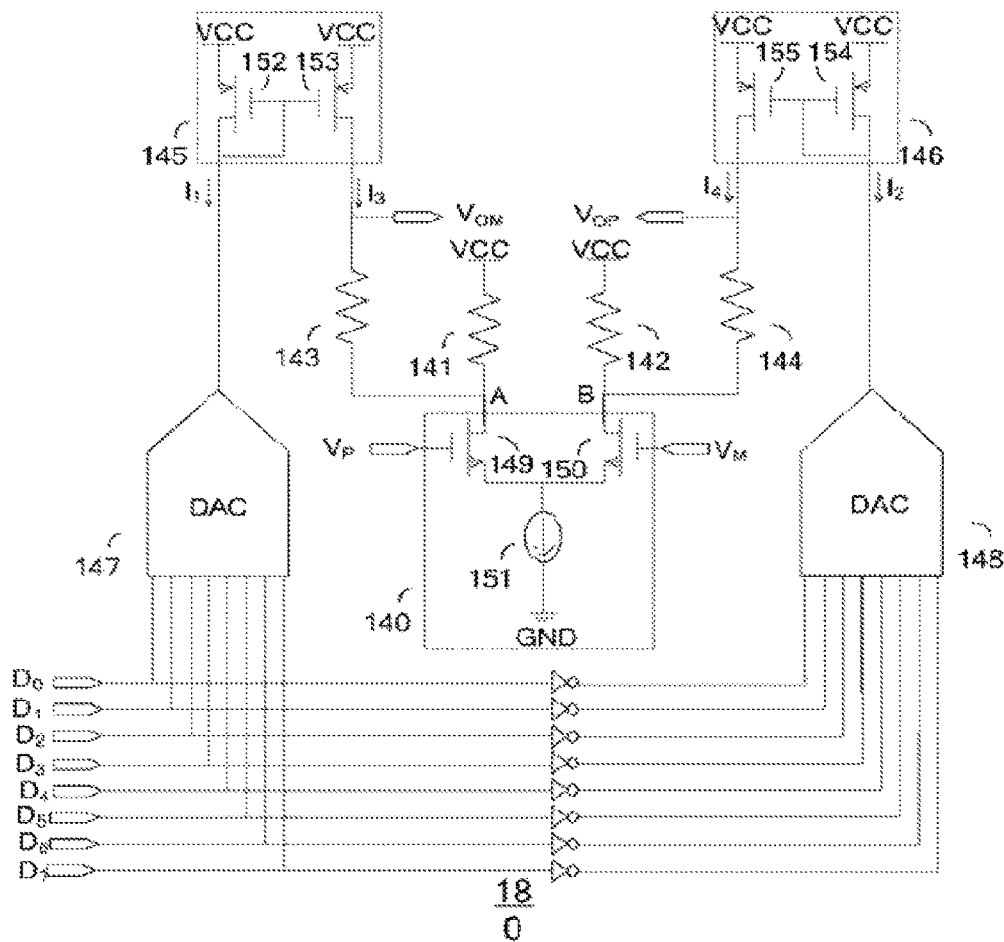
FIG. 8 is a circuit diagram of an offset digital adjustment amplifier 180 in FIG. 7.

As shown in FIG. 8, the offset digital adjustment amplifier 180 comprises a differential pair circuit 140, two symmetric load resistors 141 and 142, two symmetric offset adjustment resistors 143 and 144, two symmetric current mirrors 145 and 146, two symmetric current-mode digital-to-analog converters 147 and 148, an analog signal input port VIN, a reference signal input port VREF, non-inverting and inverting output ports VO+ and VO−, data input ports $D_0$, $D_1$, $D_2$, $D_3$, $D_4$, $D_5$, $D_6$ and $D_7$.

In addition, the offset digital adjustment amplifier 180 further comprises non-inverting and inverting input ports $V_P$ and $V_M$, non-inverting and inverting output ports $V_{OP}$ and $V_{OM}$, and digital input ends $D_0$, $D_1$, $D_2$, $D_3$, $D_4$, $D_5$, $D_6$ and $D_7$.

The differential pair circuit 140 comprises two symmetric NMOS transistors 149 and 150, and a tail current source 151. After being connected together, source electrodes of the NMOS transistors 149 and 150 are connected to a current input end of the tail current source 151; and an output end of the tail current source 151 is grounded. The gate electrode of the NMOS transistor 149 is connected to the non-inverting input port $V_P$; and the gate electrode of the NMOS transistor 150 is connected to the inverting input port $V_M$. The drain electrode of the NMOS transistor 149 is connected to the negative end of the load resistor 141; the positive end of the load resistor 141 is connected to a power supply VCC; the drain electrode of the NMOS transistor 150 is connected to the negative end of the load resistor 142; and the positive end of the load resistor 142 is connected to the power supply VCC. The positive end of the offset adjustment resistor 143 is connected to the drain electrode of the NMOS transistor 149, and a negative end thereof is connected to an output end of the current mirror 145 and an inverting output port $V_{OM}$. The positive end of the offset adjustment resistor 144 is connected to the drain electrode of the NMOS transistor 150, and the negative end thereof is connected to an output end of the current mirror 146 and a non-inverting output port $V_{OP}$.

The current mirror 145 comprises PMOS transistors 152 and 153; and the current mirror 146 comprises PMOS transistors 154 and 155. The gate and drain electrodes of the PMOS transistor 152 are connected together as an input end of current mirror 145, and the source electrode of the PMOS transistor 152 is connected to the power supply VCC. The gate electrode of the PMOS transistor 153 is connected to that of the PMOS transistor 152, the source electrode thereof is connected to the power supply VCC, and the drain electrode thereof is used as an output end of the current mirror 145. The gate and drain electrodes of the PMOS transistor 154 are connected together as an input end of current mirror 146, and the source electrode thereof is connected to the power supply VCC. The gate electrode of the PMOS transistor 155 is connected to that of the PMOS transistor 154, the source electrode thereof is connected to the power supply VCC, and the drain electrode thereof is used as an output end of the current mirror 146. The current mirror 145 mirrors input current $I_1$ thereof to the output end according to a ratio of 1:1 to obtain output current $I_3$, and the current mirror 146 mirrors input current $I_2$ thereof to the output end according to the ratio of 1:1 to obtain output current $I_4$.

An output end of the current-mode digital-to-analog converter 147 is connected to the input end of the current mirror 145, and outputs the current $I_1$; and the current output end of the current-mode digital-to-analog converter 148 is connected to the input end of the current mirror 146, and outputs the current $I_2$. The current-mode digital-to-analog converter 147 receives digital signals from the input ports $D_0$, $D_1$, $D_2$, $D_3$, $D_4$, $D_5$, $D_6$ and $D_7$. An input-output relationship of the current mode digital-to-analog converter 147 is as follows:

$$I_1 = c\Sigma_{i=0}^{7} D_1 2^i \quad (3)$$

In the above equation, c represents a constant number.

The current-mode digital-to-analog converter 148 receives complementary codes of the digital signal $D_7D_6D_5D_4D_3D_2D_1D_0$. As the current-mode digital-to-analog converter 148 is symmetric to the digital-to-analog converter 147, according to the equation (3), we obtain $$I_2 = c\Sigma_{i=0}^{7} \overline{D_i} 2^i \qquad (4)$$

Subtracting equation (4) from equation (3), we obtain $$I_1 - I_2 = c\Sigma_{i=0}^{7} D_i 2^i - c\Sigma_{i=0}^{7} \overline{D_i} 2^i \qquad (5)$$

After finishing, the following equation is obtained:

$$I_1 - I_2 = 2c\Sigma_{i=0}^{7} D_i 2^i c\Sigma_{i=0}^{7} 2^i \qquad (6)$$

Because $$I_1 = I_3 \qquad (7) \text{ and}$$

$$I_2 = I_4 \qquad (8),$$

therefore, according to equations (6), (7) and (8), the following equation is obtained:

$$I_3 - I_4 = 2c\Sigma_{i=0}^{7} D_i 2^i - c\Sigma_{i=0}^{7} 2^i \qquad (9)$$

The output ports $V_{OP}$ and $V_{OM}$ are connected to a high-impedance circuit such that the current $I_3$ flows completely through the offset adjustment resistor 143, and the current $I_4$ flows completely through the offset adjustment resistor 144. In this way, we obtain $$V_{OM} - V_{OP} = I_3 R_{143} + V_A - (I_4 R_{144} + V_B) \qquad (10).$$

In the above equation, $V_A$ and $V_B$ represent voltages at the drain electrode ends of the NMOS transistors 149 and 150, respectively.

As the resistors 143 and 144 are fully symmetric to each other, namely, $$R_{143} = R_{144} \qquad (11),$$

substituting equation (11) into equation (10), and the following equation is obtained after finishing:

$$V_{OM} - V_{OP} = (I_3 - I_4)R_{143} + (V_A - V_B) \qquad (12).$$

In addition, as $$V_A - V_B = -I_5 R_{141} + I_6 R_{142} \qquad (13), \text{ and}$$

the resistors 141 and 142 are fully symmetric to each other, namely, $$R_{141} = R_{142} \qquad (14),$$

substituting equation (14) into equation (13), we obtain $$V_A - V_B = R_{141}(I_6 - I_5) \qquad (15).$$

Substituting equation (15) into equation (12), the following equation is obtained:

$$V_{OM} - V_{OP} = R_{143}(I_3 - I_4) + R_{141}(I_6 - I_5) \qquad (16).$$

If $$V_P = V_M \qquad (17), \text{ then}$$

$$I_3 + I_5 = \frac{1}{2} I_{151}, \text{ and} \qquad (18)$$

$$I_4 + I_6 = \frac{1}{2} I_{151}. \qquad (19)$$

In the above equations, $I_{151}$ is the current supplied to the tail current source 151.

After finishing equations (18) and (19), equation (12) is substituted into and 15 and 16 are eliminated to obtain $$V_{OM} - V_{OP} = (R_{143} + R_{141})(I_3 - I_4) \qquad (20).$$

Substituting equation (9) into equation (20), we obtain:

$$V_{OP} - V_{OM} = c(R_{143} + R_{141})\Sigma_{i=0}^{7} 2^i - 2c(R_{143} + R_{141}) \Sigma_{i=0}^{7} D_i 2^i \qquad (21)$$

If $V_P = V_N$, the equation (21) represents the output offset of the offset digital adjustment amplifier 180. A voltage amplification factor of the offset digital adjustment amplifier 180 is given by $$G = g_m R_{141} \qquad (22).$$

Dividing equation (21) by equation (22), the equivalent input offset of the offset digital adjustment amplifier 180 is obtained as follows:

$$V_{io} = \frac{c}{g_m R_{141}}(R_{143} + R_{141})\sum_{i=0}^{7} 2^i - \frac{2c}{g_m R_{141}}(R_{143} + R_{141})\sum_{i=0}^{7} D_i 2^i. \qquad (23)$$

After finishing equation (23), we obtain $$V_{io} = \qquad (24)$$

$$-\frac{2c}{g_m R_{141}}(R_{143} + R_{141}) 2^7 \sum_{i=0}^{7} \frac{D_i}{2^{7-i}} + \frac{c}{g_m R_{141}}(R_{143} + R_{141})(2^8 - 1).$$

Where $g_m$ represents a transconductance coefficient of the offset digital adjustment amplifier 180; $R_{141}$ represents a resistance value of the resistor 141; and $R_{143}$ represents a resistance value of the resistor 143. In the above equation, the second term on the left side is a constant term, and is irrelevant to the digital signal $D_i$ (i=1 to 7). The first term on the left side is the weighted summation of the digital signal $D_i$ (i=1 to 7), the maximum weight bit is $D_7$, and the minimum weight bit is $D_0$. The equations (24) and (1) have the same form.

Figure 9:
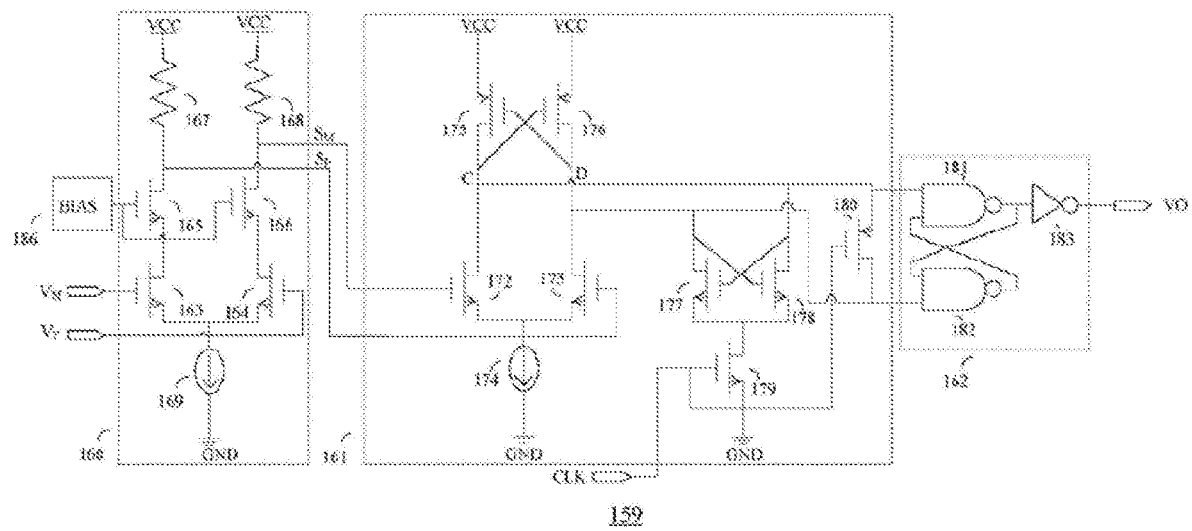
FIG. 9 is a circuit diagram of a dynamic comparator 159 in FIG. 7.

As shown in FIG. 9, the internal circuit of the dynamic comparator 159 is of a differential structure which consists of four parts: a preamplifier 160, a latch circuit 161, a digital portion 162, and a bias circuit 1866. The dynamic comparator 159 further comprises a non-inverting input port, an inverting input port, a clock input port CLK, and an output port VO.

The preamplifier 160 is a differential amplifier which is configured to provide a certain differential gain to reduce a metastable effect of the dynamic comparator 159, and which comprises two symmetric NMOS transistors 163 and 164, another two symmetric NMOS transistors 165 and 166, two symmetric resistors 167 and 168, and a tail current source 169.

The symmetric NMOS transistors 163 and 164 form a differential pair. After being connected together, the source electrodes of the NMOS transistors 163 and 164 are connected to the current input end of current source 169; and the current output end of the current source 169 is grounded. The gate electrode of the NMOS transistor 163 is connected to the inverting input port $V_M$ of the comparator 159; and the gate electrode of the NMOS transistor 164 is connected to the non-inverting input port $V_P$ of the comparator 159. The drain electrode of the NMOS transistor 163 is connected to the source electrode of the NMOS transistor 165; and the drain electrode of the NMOS transistor 164 is connected to the source electrode of the NMOS transistor 166. After being connected together, the gate electrodes of the NMOS transistors 165 and 166 are connected to the output end of the bias circuit 186. The drain electrode of the NMOS transistor 165 is connected to the negative end of the resistor 167 and outputs a voltage signal $S_P$; and the drain electrode of the NMOS transistor 166 is connected to the negative end of the resistor 168 and outputs a voltage signal $S_M$. The voltage signals $S_P$ and $S_M$ are a pair of differential signals, which are non-inverting and inverting signals respectively. The positive ends of the resistors 167 and 168 are connected to the power supply VCC.

The preamplifier 160 amplifies differential signals of the ports $V_P$ and $V_M$ to obtain differential signals $S_P$ and $S_M$.

The latch circuit 161 comprises two symmetric NMOS transistors 172 and 173, a tail current source 174, two symmetric PMOS transistors 175 and 176, two symmetric NMOS transistors 177 and 178, a PMOS switching transistor 180, and an NMOS switching transistor 179.

The NMOS transistors 172 and 173 form a differential pair. After being connected together, the source electrodes of the NMOS transistors 172 and 173 are connected to the current input end of current source 174; and the current output end of the current source 174 is grounded. The gate electrode of the NMOS transistor 172 receives the voltage signal $S_M$; and the gate electrode of the NMOS transistor 173 receives the voltage signal $S_P$. The PMOS transistors 175 and 176 are cross-coupled: the gate electrode of the PMOS transistor 175 is connected to the drain electrode of the PMOS transistor 176, and the gate electrode of the PMOS transistor 176 is connected to the drain electrode of the PMOS transistor 175. The source electrodes of the PMOS transistors 175 and 176 are connected to the power supply VCC. The drain electrode of the PMOS transistor 175 is connected to a node C, and the drain electrode of the PMOS transistor 176 is connected to a node D. The NMOS transistors 177 and 178 are cross-coupled: the gate electrode of the NMOS transistor 177 is connected to the drain electrode of the NMOS transistor 178, and the gate electrode of the NMOS transistor 178 is connected to the drain electrode of the NMOS transistor 177. The drain electrode of the NMOS transistor 177 is connected to the node D, and the drain electrode of the NMOS transistor 178 is connected to the node C. After being connected together, the source electrodes of the NMOS transistors 177 and 178 are connected to the drain electrode of the NMOS switching transistor 179, the source electrode of the NMOS switching transistor 179 is grounded, and the gate electrode of the NMOS switching transistor 179 is connected to the clock input port CLK. The source electrode of the PMOS switching transistor 180 is connected to the node C, the drain electrode thereof is connected to the node D, and the gate electrode thereof is connected to the clock input port CLK.

A working process of the latch circuit 161 is as follows: when the clock signal CLK is at a low level, the NMOS switching transistor 179 is turned off, and the cross-coupled NMOS transistors 177 and 178 do not work as no current flows through the transistors. The PMOS switching transistor is turned on, the nodes C and D are short-circuited, and the cross-coupled PMOS transistors 175 and 176 work as a diode as the gate electrodes and drain electrodes thereof are short-circuited.

The voltage signals $S_P$ and $S_M$ are applied on the gate electrodes of the differential pair transistors 173 and 172, respectively. The current of the tail current source 174 is redistributed: when $S_P$ is greater than $S_M$, the current flowing through the NMOS transistor 173 is greater than the current flowing through the NMOS transistor 172; when $S_M$ is greater than $S_P$, the current flowing through the NMOS transistor 172 is greater than the current flowing through the NMOS transistor 173. A specific distribution ratio is determined by a transconductance of the differential pair formed by the transconductance NMOS transistors 172 and 173.

When the rising edge of the clock signal CLK arrives, a level of the clock signal changes from a low level to a high level. The NMOS switching transistor 179 is turned on, and the cross-coupled NMOS transistors 177 and 178 start to work. Meanwhile, the PMOS switching transistor 180 is turned off, the nodes C and D are disconnected, and the gate electrodes and the drain electrodes of the cross-coupled PMOS transistors 175 and 176 are disconnected.

When the rising edge of the clock signal arrives, the voltage signal $S_M$ is greater than the voltage signal $S_P$, the current flowing through the transistor 172 is greater than that flowing through the transistor 173. After the nodes C and D are disconnected, a voltage at the node C is pulled down, and a voltage at the node D is pulled up. The cross-coupled NMOS transistors 177 and 178 and the cross-coupled PMOS transistors 175 and 176 form a positive feedback mechanism through which the node C is quickly pulled to a ground potential GND and the node D to a power supply VCC.

When the rising edge of the clock signal arrives, the voltage signal $S_P$ is greater than the voltage signal $S_M$, the current flowing through the transistor 173 is greater than that flowing through the transistor 172. After the nodes C and D are disconnected, a voltage at the node D is pulled down, and a voltage at the node C is pulled up. The cross-coupled NMOS transistors 177 and 178 and the cross-coupled PMOS transistors 175 and 176 form a positive feedback mechanism through which the node D is quickly pulled to the ground potential GND and the node C to the power supply VCC.

It can be seen that after being amplified by the preamplifier, a difference between the port signal $V_P$ and the port signal $V_M$ is latched on the rising edge of the clock signal, and is rapidly amplified to values between the ground and the power supply. That is, when $V_P$ is greater than $V_M$, the node C obtains a power supply potential VCC, and the node D obtains a ground potential; and when $V_P$ is smaller than $V_M$, the node D obtains a power supply potential VCC, and the node C obtains a ground potential.

The digital portion 162 comprises two NAND gates 181 and 182, and an inverter 183. The NAND gates 181 and 182 are cross-coupled: an output end of the NAND gate 181 is connected to an input end of NAND gate 182, and an output end of NAND gate 182 is connected to an input end of the NAND gate 181. The other input end of the NAND gate 181 is connected to the node C, and the other input end of the NAND gate 182 is connected to the node D. An input end of the inverter 183 is connected to the output end of the NAND gate 181, and an output end of the inverter 183 is connected to the output port VO of the dynamic comparator 159. The digital portion 162 converts differential signals of the nodes C and D into single-ended digital signals to be output.

The successive approximation register 121 in FIG. 5 adopts a conventional circuit for a successive approximation register analog-to-digital converter (SAR ADC). Those skilled in the art can refer to relevant documents of the SAR ADC to obtain circuit examples, which will not be repeated herein.

The analog signal $V_{in}$, the correction signal $V_{cal}$ and the reference signal $V_r$ in FIG. 5 may also be differential signals. In this case, the offset digital adjustment amplifier 180 adopts the circuit in FIG. 10.

Figure 10:
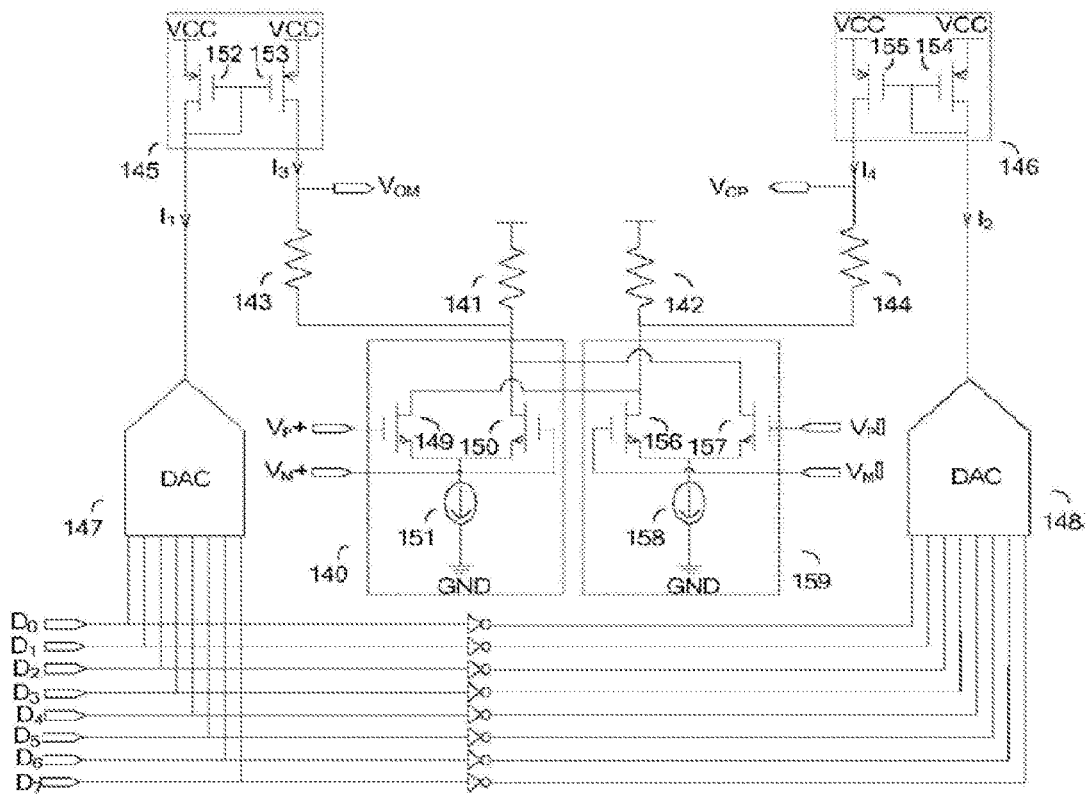
FIG. 10 is a circuit diagram of fully differential implementation of the offset digital adjustment amplifier 180 in FIG. 7.

Compared with the circuit shown in FIG. 8, in the circuit shown in FIG. 10, the non-inverting input end ($V_{P+}$, $V_{P-}$) and the inverting input end ($V_{M+}$, $V_{M-}$) are differential input ends; and another differential pair circuit 159 is added based on the circuit shown in FIG. 8, and is symmetric to the differential pair circuit 140. The differential pair circuit 159 comprises two symmetric NMOS transistors 156 and 157, and a tail current source 158. After being connected together, the source electrodes of the NMOS transistors 156 and 157 are connected to a current input end of the tail current source 158. A current output end of the tail current source 158 is grounded. The drain electrode of the NMOS transistor 156 is connected to the drain electrode of the NMOS transistor 149 and the negative end of the load resistor 141. The drain electrode of the NMOS transistor 157 is connected to the drain electrode of the NMOS transistor 150 and the negative end of the load resistor 142. The gate electrode of the NMOS transistor 149 is connected to the positive electrode $V_{P+}$ of the non-inverting differential input end, and the gate electrode of the NMOS transistor 157 is connected to the negative electrode $V_{P-}$ of the non-inverting differential input end. The gate electrode of the NMOS transistor 150 is connected to the positive electrode $V_{M+}$ of the inverting differential input end, and the gate electrode of the NMOS transistor 149 is connected to the negative electrode $V_{P-}$ of the non-inverting differential input end. Other parts of the circuit in FIG. 10 are the same as those of the circuit in FIG. 8.

What is claimed is:

1. A comparator offset voltage self-correction circuit, comprising: a comparator, an offset digital adjustment circuit, a successive approximation register, a multiplexer, an enable port, a clock port, a reference voltage input port $V_r$, an analog signal input port $V_{in}$, a correction voltage input port $V_{cal}$ and an output port, wherein the reference voltage input port $V_r$ is configured to receive a reference voltage, the correction voltage input port $V_{cal}$ is configured to receive a correction voltage, and the correction voltage is generated by a high-accuracy DAC on the same chip or by a test instrument, and is connected to a chip through a chip pin; the analog signal input port $V_{in}$ is configured to receive an analog signal; the output port is configured to output a comparison result; the multiplexer is connected to the analog signal input port $V_{in}$ during normal operation, and is connected to the correction voltage input port $V_{cal}$ during correction; the reference voltage input port $V_r$ is connected to a port A of the offset digital adjustment circuit, a port B of the offset digital adjustment circuit is connected to an inverting input end $V_M$ of the comparator, and a non-inverting input end of the comparator is connected to an output port of the multiplexer; a first input port of the multiplexer is connected to the correction voltage input port $V_{cal}$, and a second input port of the multiplexer is connected to the analog signal input port $V_{in}$; an output end of the comparator is connected to a data input end $D_{1n}$ of the successive approximation register, an enable end of the successive approximation register is connected to the enable port, and a clock end of the successive approximation register is connected to the clock port; data output ports $D_0$, $D_1$, $D_2$, $D_3$, $D_4$, $D_5$, $D_6$ and $D_7$ of the successive approximation register output data signals $D_0$, $D_1$, $D_2$, $D_3$, $D_4$, $D_5$, $D_6$ and $D_7$ which control data ports $D_0$, $D_1$, $D_2$, $D_3$, $D_4$, $D_5$, $D_6$ and $D_7$ of the offset digital adjustment circuit, respectively; a voltage $V_{AB}$ between the port B and the port A of the offset digital adjustment circuit is $$V_{AB} = V_S \sum_{i=0}^{7} \frac{D_i}{2^{8-i}} - \frac{V_s}{2},$$

wherein $V_s$ is a designed voltage value.

2. The comparator offset voltage self-correction circuit of claim 1, wherein a relationship between the $V_{AB}$ between the port B and the port A of the offset digital adjustment circuit and the data ports $D_0$, $D_1$, $D_2$, $D_3$, $D_4$, $D_5$, $D_6$ and $D_7$ of the offset digital adjustment circuit is a weighted summation relationship with an offset of $V_s/2$, the lowest weight bit being $D_0$, the highest weight bit being $D_7$, and the minimum change step size is $V_s/2^7$.

3. The comparator offset voltage self-correction circuit of claim 1, wherein an electric potential of the inverting input end $V_M$ of the comparator is the sum of a voltage of the reference voltage input port $V_r$ and a voltage drop of the ports of the offset digital adjustment circuit.

4. The comparator offset voltage self-correction circuit of claim 1, wherein a correction process of the comparator offset voltage self-correction circuit is as follows:
first, the enable signal is at a low level, the successive approximation register is reset, the digital signals $D_7$, $D_6$, $D_5$, $D_4$, $D_3$, $D_2$, $D_1$ and $D_0$ adopt a default value 10,000,000, a port voltage drop of the offset digital adjustment circuit is 0, and an electric potential of the inverting input end $V_M$ of the comparator is the sum of a reference voltage and a comparator offset voltage;
second, the level of the enable signal jumps from a low level to a high level to start a correction process, the first input port of the multiplexer is connected so that a correction voltage $V_{cal}$ is selected;
third, a rising edge of the first clock signal arrives, the successive approximation register keeps the default value 10,000,000 of the digital signals $D_7$, $D_6$, $D_5$, $D_4$, $D_3$, $D_2$, $D_1$ and $D_0$ unchanged, and the electric potential of the inverting input end $V_M$ of the comparator is unchanged;
fourth, the comparator compares voltage signals of the non-inverting input end and the inverting input end of the comparator, and feeds a comparison result back to the data input end $D_{1n}$ of the successive approximation register;
if $V_M$ is lower than $V_{cal}$, when the rising edge of the second clock signal arrives, the successive approximation register keeps $D_7$ at 1, while setting $D_6$ as 1, and increasing $V_M$ by $V_s/4$; or
if $V_M$ is higher than $V_{cal}$, when the rising edge of the second clock signal arrives, the successive approximation register sets $D_7$ as 0, while setting $D_6$ as 1, and decreasing $V_M$ by $V_s/4$;
fifth, the comparator compares $V_M$ with $V_{cal}$ again, and feeds a comparison result back to the data input end Din of the successive approximation register;
if $V_M$ is lower than $V_{cal}$, when the rising edge of the third clock signal arrives, the successive approximation register keeps $D_6$ at 1, while setting $D_5$ as 1, and increasing $V_M$ by $V_s/8$; or
if $V_M$ is higher than $V_{cal}$, when the rising edge of the third clock signal arrives, the successive approximation register sets $D_6$ as 0, while setting $D_5$ as 1, and decreasing $V_M$ by $V_s/8$;
sixth, the comparator compares $V_M$ with $V_{cal}$ again, and feeds a comparison result back to the data input end Din of the successive approximation register;

if $V_M$ is lower than $V_{cal}$, when the rising edge of the fourth clock signal arrives, the successive approximation register keeps $D_5$ at 1, while setting $D_4$ as 1, and increasing $V_M$ by $V_s/16$; or if $V_M$ is higher than $V_{cal}$, when the rising edge of the fourth clock signal arrives, the successive approximation register sets $D_5$ as 0, while setting $D_4$ as 1, and decreasing $V_M$ by $V_s/16$;

similarly, when the rising edge of the fifth clock signal arrives, the successive approximation register determines $D_4$; when the rising edge of the sixth clock signal arrives, the successive approximation register determines $D_3$; when the rising edge of the seventh clock signal arrives, the successive approximation register determines $D_2$; when the rising edge of the eighth clock signal arrives, the successive approximation register determines $D_1$; when the rising edge of the ninth clock signal arrives, the successive approximation register determines $D_0$, and so far, the correction process is completed; and the values of the digital signals $D_7$, $D_6$, $D_5$, $D_4$, $D_3$, $D_2$, $D_1$ and $D_0$ are kept by the successive approximation register and used in normal operation of the comparator.

5. The comparator offset voltage self-correction circuit of claim 4, wherein in the entire correction process, according to the comparison results of the comparator, the electric potential of the inverting input end $V_M$ of the comparator is sequentially increased or decreased by $V_s/2^2$, $V_s/2^3$, $V_s/2^4$, $V_s/2^5$, $V_s/2^6$, $V_s/2^7$, $V_s/2^8$ and $V_s/2^8$ based on $V_{cal}$, and gradually converges at $V_{cal}$; finally, the difference between $V_M$ and $V_{cal}$ is only $V_s/2^8$; the smaller the $V_s$ is, the closer the $V_M$ is to $V_{cal}$, and meanwhile, the narrower the correction range is; a higher correction digit is adopted to maintain higher correction accuracy and a wider correction range.

6. The comparator offset voltage self-correction circuit of claim 1, wherein an actual reference voltage of the comparator is corrected to be close to $V_{cal}$ and reaches certain correction accuracy; and $V_{cal}$ is not affected by the comparator offset voltage, and is designable and controllable.

7. A comparator offset voltage self-correction circuit, comprising: a multiplexer, an offset digital adjustment amplifier, a dynamic comparator, a successive approximation register, an analog signal input port $V_{in}$, a correction signal input port $V_{cal}$, a reference signal input port $V_r$, a clock port, an enable port and an output port, wherein the analog signal input port $V_{in}$ is configured to receive an analog signal; the correction signal input port $V_{cal}$ is configured to receive a correction signal; the reference signal input port $V_r$ is configured to receive a reference signal; the clock port is configured to receive an input clock signal; the enable port is configured to start a correction process; the output port is configured to output a comparison result; a first selection end of the multiplexer is connected to the correction signal input port $V_{cal}$, a second selection end of the multiplexer is connected to the analog signal input port $V_{in}$, and an output end of the multiplexer is connected to a non-inverting input end $V_P$ of the offset digital adjustment amplifier; an inverting input end $V_M$ of the offset digital adjustment amplifier is connected to the reference signal input port $V_r$; a non-inverting output end $V_{OP}$ of the offset digital adjustment amplifier is connected to a non-inverting input end $V_P$ of the dynamic comparator; an inverting output end $V_{OM}$ of the offset digital adjustment amplifier is connected to an inverting input end $V_M$ of the dynamic comparator; an output end of the dynamic comparator is connected to the output port; digital output ends $D_0$, $D_1$, $D_2$, $D_3$, $D_4$, $D_5$, $D_6$ and $D_7$ of the successive approximation register are connected to digital input ends $D_0$, $D_1$, $D_2$, $D_3$, $D_4$, $D_5$, $D_6$ and $D_7$ of the offset digital adjustment amplifier, an enable end of the successive approximation register is connected to the enable port, a clock end of the successive approximation register is connected to the clock input port, and a data end Din of the successive approximation register is connected to an output end of the dynamic comparator; the clock input port is connected to the clock ends of both the successive approximation register and the dynamic comparator; and an equivalent input offset of the offset digital adjustment amplifier is $$V_{io} = -\frac{2c}{g_m R_{141}}(R_{143}+R_{141})2^7 \sum_{i=0}^{7}\frac{D_i}{2^{7-i}} + \frac{c}{g_m R_{141}}(R_{143}+R_{141})(2^8-1),$$

wherein c is a constant, $g_m$ represents a transconductance coefficient of the offset digital adjustment amplifier, $R_{141}$ represents a resistance value of a resistor, and $R_{143}$ represents a resistance value of a resistor.

8. The comparator offset voltage self-correction circuit of claim 7, wherein the offset digital adjustment amplifier comprises a differential pair circuit, two symmetric load resistors, two symmetric offset adjustment resistors, two symmetric current mirrors, two symmetric current-mode digital-to-analog converters, an analog signal input port $V_{IN}$, a reference signal input port VREF, non-inverting and inverting output ports VO+ and VO−, data input ports $D_0$, $D_1$, $D_2$, $D_3$, $D_4$, $D_5$, $D_6$ and $D_7$, non-inverting and inverting input ports $V_P$ and $V_M$ non-inverting and inverting output ports $V_{OP}$ and $V_{OM}$, and digital input ends $D_0$, $D_1$, $D_2$, $D_3$, $D_4$, $D_5$, $D_6$ and $D_7$; the differential pair circuit comprises two symmetric NMOS transistors, and a tail current source; after being connected together, source electrodes of the NMOS transistors are connected to a current input end of the tail current source; an output end of the tail current source is grounded; the gate electrode of the NMOS transistor is connected to the non-inverting input port $V_P$; the gate electrode of the NMOS transistor is connected to the inverting input port $V_M$; the drain electrode of the NMOS transistor is connected to the negative end of the load resistor; the positive end of the load resistor is connected to a power supply; the drain electrode of the NMOS transistor is connected to the negative end of the load resistor; the positive end of the load resistor is connected to the power supply; the positive end of the offset adjustment resistor is connected to the drain electrode of the NMOS transistor, and the negative end of the offset adjustment resistor is connected to an output end of the current mirror and the inverting output port $V_{OM}$; the positive end of the offset adjustment resistor is connected to the drain electrode of the NMOS transistor, and the negative end of the offset adjustment resistor is connected to an output end of the current mirror and the non-inverting output port VO+; the current mirror comprises PMOS transistors; the current mirror comprises PMOS transistors; the gate and drain electrodes of the PMOS transistor are connected together as an input end of the current mirror, and the source electrode of the PMOS transistor is connected to the power supply; the gate electrode of the PMOS transistor is connected to that of the PMOS transistor, the source electrode of the PMOS transistor is connected to the power supply, and the drain electrode of the PMOS transistor is used as an output end of the current mirror; the gate and drain electrodes of the PMOS transistor are connected together as an input end of the current mirror, and the source electrode of the PMOS transistor is connected to the power supply; the gate electrode of the PMOS transistor is connected to that of the PMOS transistor, the source electrode of the PMOS transistor is connected to the power supply, and the drain electrode of the PMOS transistor is used as an output end of the current mirror; the current mirror mirrors input current $I_1$ thereof to the output end according to a ratio of 1:1 to obtain output current $I_3$, and the current mirror mirrors input current $I_2$ thereof to the output end according to the ratio of 1:1 to obtain output current $I_4$; an output end of the current-mode digital-to-analog converter is connected to the input end of the current mirror, and outputs the current $I_1$; the current output end of the current-mode digital-to-analog converter is connected to the input end of the current mirror, and outputs the current $I_2$; the current-mode digital-to-analog converter receives digital signals from the input ports $D_0$, $D_1$, $D_2$, $D_3$, $D_4$, $D_5$, $D_6$ and $D_7$; and the current-mode digital-to-analog converter receives complementary codes of the digital signals $D_7D_6D_5D_4D_3D_2D_1D_0$.

9. The comparator offset voltage self-correction circuit of claim 7, wherein the dynamic comparator is of a differential structure, comprising: a preamplifier, a latch circuit, a digital portion, a bias circuit, a non-inverting input port, an inverting input port, a clock input port and an output port; the preamplifier is a differential amplifier which is configured to provide a certain differential gain to reduce a metastable effect of the dynamic comparator, and which comprises two symmetric NMOS transistors, another two symmetric NMOS transistors, two symmetric resistors, and a tail current source; the symmetric NMOS transistors form a differential pair, after being connected together, the source electrodes of the NMOS transistors are connected to a current input end of the tail current source; a current output end of the tail current source is grounded; the gate electrode of the NMOS transistor is connected to the inverting input port $V_M$ of the comparator; the gate electrode of the NMOS transistor is connected to the non-inverting input port $V_P$ of the comparator; the drain electrode of the NMOS transistor is connected to the source electrode of the NMOS transistor; the drain electrode of the NMOS transistor is connected to the source electrode of the NMOS transistor; after being connected together, the gate electrodes of the NMOS transistors are connected to the output end of the bias circuit; the drain electrode of the NMOS transistor is connected to the negative end of the resistor and outputs a voltage signal $S_P$; the drain electrode of the NMOS transistor is connected to the negative end of the resistor 168 and outputs a voltage signal $S_M$; the voltage signals $S_P$ and $S_M$ are a pair of differential signals, which are non-inverting and inverting signals respectively; the positive ends of the resistors are connected to the power supply; and the preamplifier amplifies the differential signals from the ports $V_P$ and $V_M$ to obtain differential signal $S_P$ and $S_M$; the latch circuit comprises two symmetric NMOS transistors, a tail current source, two symmetric PMOS transistors, two symmetric NMOS transistors, a PMOS switching transistor, and an NMOS switching transistor; the NMOS transistors form a differential pair; after being connected together, the source electrodes of the NMOS transistors are connected to the current input end of current source; and the current output end of the current source is grounded; the gate electrode of the NMOS transistor receives the voltage signal $S_M$; the gate electrode of the NMOS transistor receives the voltage signal $S_P$; the PMOS transistors are cross-coupled: the gate electrode of the PMOS transistor is connected to the drain electrode of the PMOS transistor, and the gate electrode of the PMOS transistor is connected to the drain electrode of the PMOS transistor; the source electrodes of the PMOS transistors are connected to the power supply; the drain electrode of the PMOS transistor is connected to a node C, and the drain electrode of the PMOS transistor is connected to a node D; the NMOS transistors are cross-coupled: the gate electrode of the NMOS transistor is connected to the drain electrode of the NMOS transistor, and the gate electrode of the NMOS transistor is connected to the drain electrode of the NMOS transistor; the drain electrode of the NMOS transistor is connected to the node D, and the drain electrode of the NMOS transistor is connected to the node C; after being connected together, the source electrodes of the NMOS transistors are connected to the drain electrode of the NMOS switching transistor, the source electrode of the NMOS switching transistor is grounded, and the gate electrode of the NMOS switching transistor is connected to the clock input port; the source electrode of the PMOS switching transistor is connected to the node C, the drain electrode of the PMOS switching transistor is connected to the node D, and the gate electrode of the PMOS switching transistor is connected to the clock input port; the digital portion comprises two NAND gates, and an inverter; the NAND gates are cross-coupled: an output end of the NAND gate is connected to an input end of NAND gate, and an output end of NAND gate is connected to an input end of the NAND gate; and the other input end of the NAND gate is connected to the node C, and the other input end of the NAND gate is connected to the node D; an input end of the inverter is connected to the output end of the NAND gate, and an output end of the inverter is connected to the output port of the dynamic comparator; and the digital portion converts differential signals of the nodes C and D into single-ended digital signals to be output.

10. The comparator offset voltage self-correction circuit of claim 9, wherein a working process of the latch circuit is as follows:

when the clock signal is at a low level, the NMOS switching transistor is turned off, and the cross-coupled NMOS transistors do not work as no current flows through the transistors; the PMOS switching transistor is turned on, the nodes C and D are short-circuited, and the cross-coupled PMOS transistors work as a diode as the gate electrodes and drain electrodes thereof are short-circuited;

the voltage signals $S_P$ and $S_M$ are applied on the gate electrodes of the differential pair transistors, respectively; the current of the tail current source is redistributed: when $S_P$ is greater than $S_M$, the current flowing through the NMOS transistor is greater than the current flowing through the NMOS transistor; when $S_M$ is greater than $S_P$, the current flowing through the NMOS transistor is greater than the current flowing through the NMOS transistor, wherein a specific distribution ratio is determined by a transconductance of the differential pair formed by the transconductance NMOS transistors 172 and 173;

when the rising edge of the clock signal arrives, a level of the clock signal changes from a low level to a high level; the NMOS switching transistor is turned on, and the cross-coupled NMOS transistors start to work; meanwhile, the PMOS switching transistor is turned off, the nodes C and D are disconnected, and the gate electrodes and the drain electrodes of the cross-coupled PMOS transistors are disconnected;

when the rising edge of the clock signal arrives, the voltage signal $S_M$ is greater than the voltage signal $S_P$, the current flowing through the transistor is greater than the current flowing through the transistor; after the nodes C and D are disconnected, a voltage at the node C is pulled down, and a voltage at the node D is pulled up; the cross-coupled NMOS transistors and the cross-coupled PMOS transistors form a positive feedback mechanism through which the node C is quickly pulled to a ground potential and the node D to a power supply;

when the rising edge of the clock signal arrives, the voltage signal $S_P$ is greater than the voltage signal $S_M$, the current flowing through the transistor is greater than the current flowing through the transistor; after the nodes C and D are disconnected, a voltage at the node D is pulled down, and a voltage at the node C is pulled up; the cross-coupled NMOS transistors and the cross-coupled PMOS transistors form a positive feedback mechanism through which the node D is quickly pulled to the ground potential and the node C to the power supply;

it can be seen that after being amplified by the preamplifier, a difference between the port signal $V_P$ and the port signal $V_M$ is latched on the rising edge of the clock signal, and is rapidly amplified to values between the ground and the power supply; that is, when $V_P$ is greater than $V_M$, the node C obtains a power supply potential, and the node D obtains a ground potential; and when $V_P$ is smaller than $V_M$, the node D obtains a power supply potential, and the node C obtains a ground potential.

\* \* \* \* \*